United States Patent [19]
Crane, Jr. et al.

[11] Patent Number: 6,078,102
[45] Date of Patent: Jun. 20, 2000

[54] SEMICONDUCTOR DIE PACKAGE FOR MOUNTING IN HORIZONTAL AND UPRIGHT CONFIGURATIONS

[75] Inventors: Stanford W. Crane, Jr., Boca Raton; Lakshminarasimha Krishnapura, Delray Beach, both of Fla.

[73] Assignee: Silicon Bandwidth, Inc., Fremont, Calif.

[21] Appl. No.: 09/033,480

[22] Filed: Mar. 3, 1998

[51] Int. Cl.⁷ .................................................. H01L 23/04
[52] U.S. Cl. ........................................... 257/730; 257/693
[58] Field of Search .................................. 257/692–696, 257/730

[56] References Cited

U.S. PATENT DOCUMENTS

| | | |
|---|---|---|
| 3,337,838 | 8/1967 | Damiano et al. . |
| 3,366,915 | 1/1968 | Miller . |
| 3,444,506 | 5/1969 | Wedekind . |
| 4,487,463 | 12/1984 | Tillotson . |
| 4,616,406 | 10/1986 | Brown . |
| 4,655,526 | 4/1987 | Shaffer . |
| 4,698,663 | 10/1987 | Sugimoto et al. . |
| 4,734,042 | 3/1988 | Martens et al. . |
| 4,897,055 | 1/1990 | Jurista et al. . |
| 4,943,846 | 7/1990 | Shirling . |

(List continued on next page.)

FOREIGN PATENT DOCUMENTS

| | | |
|---|---|---|
| 0-155-044 | 2/1985 | European Pat. Off. . |
| 0-438-165-A2 | 1/1991 | European Pat. Off. . |
| 0-467-698-A2 | 7/1991 | European Pat. Off. . |
| 3737819 A1 | 11/1987 | Germany . |
| 62-81739 | 10/1985 | Japan . |
| 61-225841 | 10/1986 | Japan ..................................... 257/696 |
| 2-174-538 | 4/1985 | United Kingdom . |
| PCT/US95/ 02675 | 3/1995 | WIPO . |

OTHER PUBLICATIONS

D.C.C. News—"Dimensional Circuits Corporation Awarded Two U.S. Patents", Apr. 5, 1984.

Gregoire, George D. Dimensional Circuits Corp., "3–Dimensional Circuitry Solves Fine Pitch SMT Device Assembly Problem", Connection Technology.

Balde, John W., Amey, Daniel I., Special Feature: "New Chip Carrier Package Concepts", Computer, IEEE Computer Society, Dec. 1977.

"Packaging", Intel Corporation.

"Shrouded Headers", Du Pont Connector Systems, Product Catalog A: Connector Systems.

Product Guide, Catalog 82750, Issued Jun. 1991, hammond electronics.

(List continued on next page.)

*Primary Examiner*—David Hardy
*Attorney, Agent, or Firm*—Morgan, Lewis & Bockius LLP

[57] ABSTRACT

A semiconductor die package includes a housing and a plurality of leads extending through openings in the housing. The package is designed to be mounted to a printed circuit board in both a horizontal configuration and in an upright configuration. In the horizontal configuration, the face of the die is held parallel to the surface of the printed circuit board. An edge of the die faces the printed circuit board when the package is mounted in an upright configuration. The leads are L-shaped so that either an end surface or an outer side surface of the lead can be surface mounted to the printed circuit board. The leads may extend from only one side wall of the housing. In this case, the housing may include a standoff on a bottom surface adjacent a side wall opposite the leads to balance the housing. Alternatively, stabilizing leads may be provided from the opposite side wall to improve horizontal mounting stability. To improve upright mounting stability, the leads may extend from the one side of the housing in two rows. The housing may be L-shaped to increase the separation between the two rows of leads. The semiconductor die package may house a sensor die or both a sensor die and a controller die.

35 Claims, 20 Drawing Sheets

U.S. PATENT DOCUMENTS

| | | |
|---|---|---|
| 4,975,066 | 12/1990 | Sucheski et al. . |
| 4,997,376 | 3/1991 | Buck et al. . |
| 5,008,734 | 4/1991 | Dutta et al. . |
| 5,037,311 | 8/1991 | Frankeny et al. . |
| 5,049,974 | 9/1991 | Nelson et al. . |
| 5,071,363 | 12/1991 | Reylek et al. . |
| 5,081,563 | 1/1992 | Feng et al. . |
| 5,091,772 | 2/1992 | Kohara et al. . |
| 5,123,164 | 6/1992 | Shaheen et al. . |
| 5,137,456 | 8/1992 | Desai et al. . |
| 5,138,438 | 8/1992 | Masayuki et al. . |
| 5,281,151 | 1/1994 | Arima et al. . |
| 5,285,104 | 2/1994 | Kondo et al. . |
| 5,309,024 | 5/1994 | Hirano . |
| 5,326,936 | 7/1994 | Taniuchi et al. . |
| 5,334,279 | 8/1994 | Gregoire . |
| 5,342,999 | 8/1994 | Frei et al. . |
| 5,349,235 | 9/1994 | Lee et al. ................................ 257/693 |
| 5,351,393 | 10/1994 | Gregoire . |
| 5,371,404 | 12/1994 | Juskey et al. . |
| 5,376,825 | 12/1994 | Tukamoto et al. . |
| 5,572,604 | 11/1996 | Ammon et al. . |
| 5,635,760 | 6/1997 | Ishikawa ................................ 257/696 |

OTHER PUBLICATIONS

AMP–ASC Interconnection Systems Product Information Bulletin, copyright 1991.

Barnhouse, Robert, "Bifurcated Through–Hole Technology—An Innovative Solution to Circuit Density", Connection Technology, Feb. 1992.

Gregoire, George D., "Very Find Line Recessed Circuitry—A New PCB Fabrication Process", pp. 1223–1230.

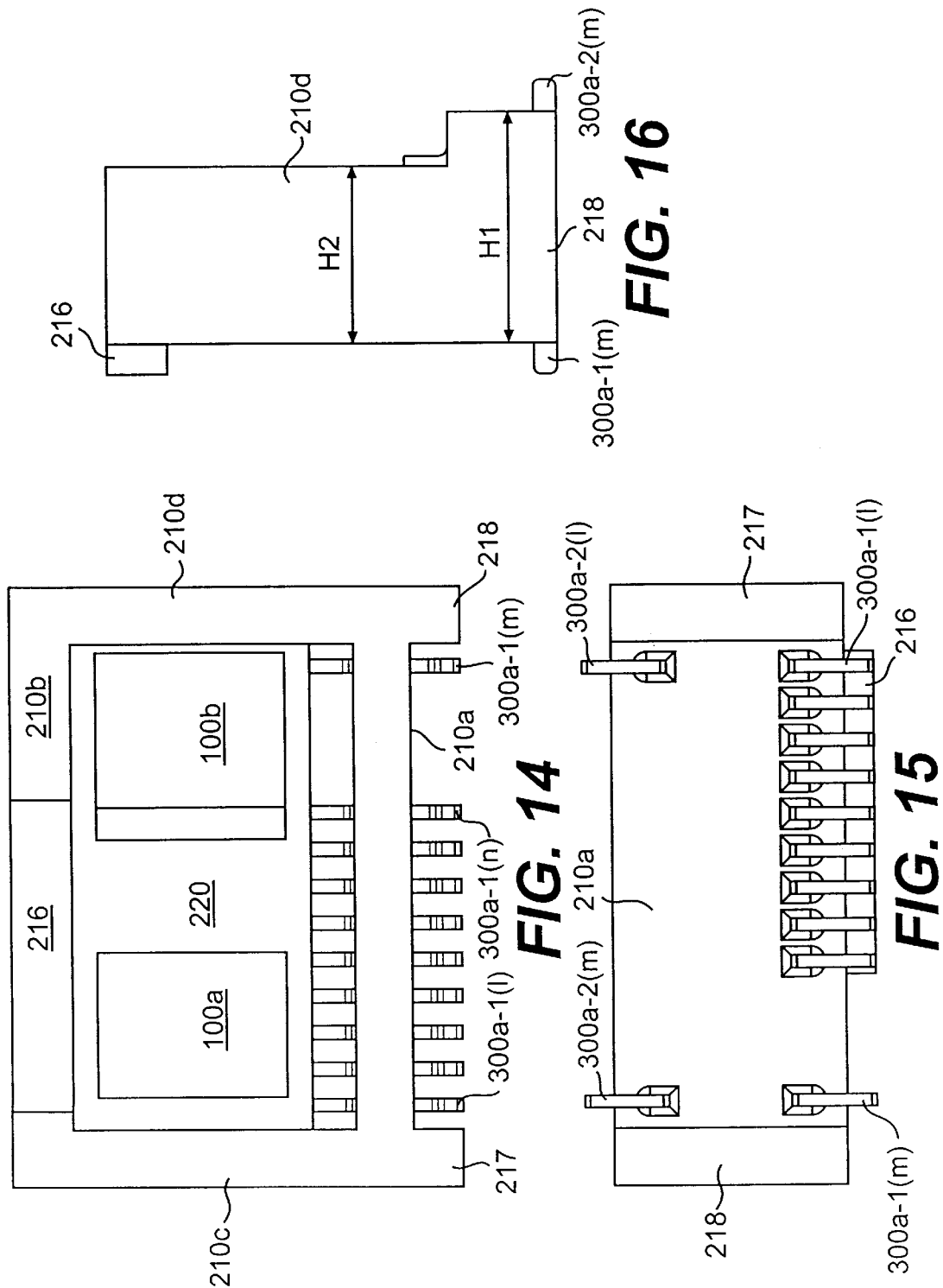

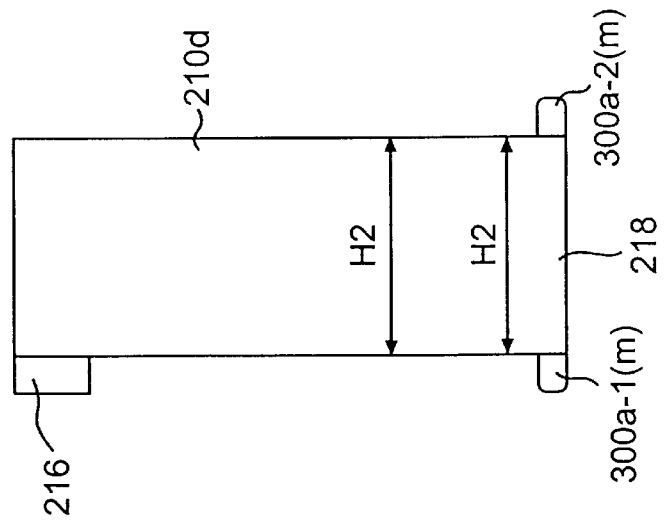
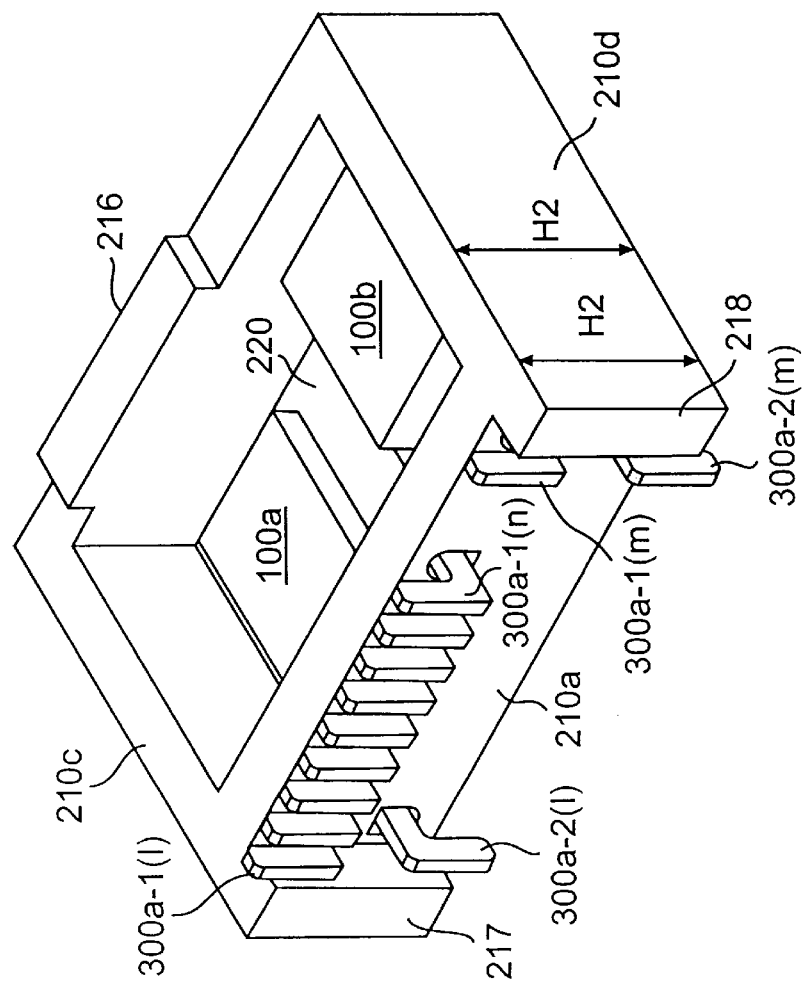
FIG. 18
FIG. 17

SEMICONDUCTOR DIE PACKAGE FOR MOUNTING IN HORIZONTAL AND UPRIGHT CONFIGURATIONS

RELATED APPLICATIONS

This application is related in subject matter to U.S. application Ser. No. 08/208,586, entitled "Prefabricated Semiconductor Chip Carrier", filed Mar. 11, 1994, expressly incorporated by reference herein; U.S. application Ser. No. 08/465,146, entitled "Method of Manufacturing A Semiconductor Chip Carrier", filed Jun. 5, 1995, expressly incorporated by reference herein; U.S. application Ser. No. 08/487,103, entitled "Semiconductor Die Carrier Having Double-Sided Die Attach Plate", filed Jun. 7, 1995, expressly incorporated by reference herein; U.S. application Ser. No. 08/902,032, entitled "Semiconductor Die Carrier Having A Dielectric Epoxy Between Adjacent Leads", filed Jul. 29, 1997, which is a continuation of U.S. application Ser. No. 08/487,100, filed Jun. 7, 1995, expressly incorporated by reference herein; U.S. application Ser. No. 08/482,000, entitled "Low Profile Semiconductor Die Carrier", filed Jun. 7, 1995, expressly incorporated by reference herein; and U.S. patent application Ser. No. 08/970,379, entitled "Multi-Chip Module Having Interconnect Dies", filed Nov. 14, 1997, expressly incorporated by reference herein.

BACKGROUND OF THE INVENTION

1. Field of the Invention

The present invention relates to a semiconductor die package that may be mounted to a printed circuit board in both horizontal and upright configurations and, more particularly, to a semiconductor die package that houses a logic die and a sensor die and that provides a stable and durable surface mounting connection to a printed circuit board in both horizontal and upright configurations.

2. Description of the Related Art

A semiconductor die or chip is an electrical component on which a microcircuit is built. The microcircuits can be interconnected together on the printed circuit board to form larger electrical circuits for use in radios, televisions, compact disk players, and computers, to name just a few. Because the semiconductor die is fragile, it is encased in a semiconductor die package to protect it from the environment. Therefore, if one were to look inside an electronic device, such as a computer or a compact disk player, one would see one or more printed circuit boards on which semiconductor die packages are mounted and electrically interconnected.

The semiconductor die package includes a housing that holds the semiconductor die and conductive leads or pins that extend from the bottom or sides of the housing. The conductive leads are electrically connected to the semiconductor die within the housing. The outside ends of the leads are soldered to conductive paths on the printed circuit board. This secures the semiconductor die package to the printed circuit board and permits electrical signals to pass between the semiconductor die and other components on the printed circuit board.

In a conventional semiconductor die package, a housing holds the semiconductor die such that the active surface of the semiconductor die, i.e., the surface on which the microcircuit is built, faces away from a printed circuit board. However, it is also known to use a flip-chip arrangement, in which the semiconductor die is held in the housing so that the active surface of the semiconductor die faces the printed circuit board. In both cases, the active surface of the semiconductor die is held horizontal to the surface of the printed circuit board when the semiconductor die package is mounted to the printed circuit board.

Conductive leads extending from the bottom of the package housing are typically arranged in rows and columns. A pin grid array (PGA) is an example of this type of package. The package mounts to the printed circuit board in a horizontal configuration so that the active surface of the semiconductor die and the bottom of the package housing are parallel to the surface of the printed circuit board. Each conductive lead of the array inserts into a preformed plated-through-hole (PTH) in the printed circuit board to make an electrical connection.

Conductive leads that extend from the sides of the package housing are typically bent downward toward the printed circuit board. This enables the conductive leads to make electrical contact with the printed circuit board when the package is mounted to the printed circuit board in a horizontal configuration. The conductive leads usually extend from two or four sides of the package. Examples of these types of packages are the two-sided dual in-line package (DIP) and the four-sided quad flat package (QFP). Dual in-line packages use plated-through-hole connections to mount to the printed circuit board. Quad flat packages are surface mounted by soldering the package leads to conductive pads on the surface of the printed circuit board. Generally, surface mounting is preferred over plated-through-hole mounting for a variety of reasons which will not be discussed in detail here.

Some packages are designed to mount in an upright configuration such that the semiconductor die is on edge with respect to the surface of the printed circuit board. Examples of such packages are the single in-line package (SIP) and the zig-zag in-line package (ZIP). Both the single in-line package and the zig-zag in-line package having long leads extending from one side of the package and mount to printed circuit boards using plated-through-hole technology.

In certain applications, the ability to mount the semiconductor package either in the horizontal configuration or in an upright configuration is desirable. For example, some semiconductor dies operate as sensors to generate signals as a function of the direction in which they are held. One such semiconductor sensor is used to trigger inflation of a car's air bag when a rapid deceleration is sensed. Conventional packages are not adapted to be mounted both in horizontal and upright configurations. For example, a pin grid array has a two dimensional array of leads extending from the bottom of the housing and dual in-line packages and quad flat packages have electrically-active leads on multiple sides. Mounting such packages in an upright configuration would prevent some of the leads from contacting the printed circuit board. Moreover, the leads lack the strength and rigidity to establish a stable connection to the printed circuit board in an upright configuration. The leads could bend or break.

The durability of the connection between the semiconductor die package and the printed circuit board is critical in many applications. For example, packages that house semiconductor sensors are often used where environmental conditions are harsh, for example, in automobiles and airplanes. The connection between the package and the printed circuit board must endure high levels of stress and vibration and exposure to weather, dust, and dirt. Durability is a function, in part, of the mounting stability of the semiconductor die package on the printed circuit board. Therefore, the semiconductor package must be capable of providing a stable and durable connection to the printed circuit board in both horizontal and upright configurations.

One solution to this problem is to attach an extension or adaptor board at a right angle to the main printed circuit board. For example, a connector can be used to electrically connect the extension board to the main printed circuit board. The semiconductor package then can be mounted to the extension board in a configuration that is horizontal to the extension board, but upright with respect to the main circuit board. However, the use of extension boards complicates manufacture and drives up the cost. Therefore, there is a need for a durable and economical semiconductor die package that can mount to a printed circuit board both in horizontal and vertical configurations.

SUMMARY OF THE INVENTION

The present invention has been made in view of the above circumstances and has as an object to provide an economical semiconductor die package that mounts in both horizontal and upright configurations.

It is a further object of the invention to provide an economical semiconductor die package for holding multiple semiconductor dies and that mounts in both horizontal and upright configurations.

It is a further object of the invention to provide a semiconductor die package for providing a stable and durable surface mount connection to a substrate in both horizontal and upright configurations.

It is a further object of the invention to provide a semiconductor die package that provides a stable and durable surface mount connection to a substrate in both horizontal and upright configurations without the use of extension boards.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a semiconductor die package having a housing for holding at least one semiconductor die and a plurality of L-shaped, electrically-conductive leads extending from the housing. The leads include a vertically-extending surface for surface mounting to a printed circuit board when the semiconductor die package is mounted to the printed circuit board in an upright configuration and horizontally-extending surface for surface mounting to a printed circuit board when the semiconductor die package is mounted to the printed circuit board in a horizontal configuration.

The invention further comprises a semiconductor die package having a package housing for housing at least one semiconductor die and a plurality of L-shaped conductive leads. The package housing has a top, a bottom, and a plurality of outer side surfaces. The bottom surface includes a standoff extending therefrom that is adjacent a first outer side surface of the housing. The L-shaped leads extend from a second outer side surface of the housing opposite the first outer side surface. Each of the L-shaped leads have an outer side surface for surface mounting to a printed circuit board when the semiconductor die package is mounted to a printed circuit board in an upright configuration and an end surface for surface mounting to the printed circuit board when the semiconductor die package is mounted to the printed circuit board in a horizontal configuration. The end surface of each lead is substantially coplanar with the standoff.

The invention also comprises a semiconductor die package having a substantially L-shaped package housing for holding at least one semiconductor die, and a plurality of leads extending from an exterior surface of the package housing. The L-shaped package may include a first outer side surface that is substantially L-shaped, a second outer side surface that is substantially L-shaped and that is opposite the first outer side surface, and a third outer side surface that joins the first and second outer side surfaces. The plurality of leads extend from the outer third side surface, for example, in first and second spaced-apart rows. In such a case, the leads may be L-shaped and the leads of the first row and the leads of the second row may point in different directions.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiment(s) of the invention and together with the description, serve to explain the principles of the invention.

FIG. 14 shows the bottom of the semiconductor die package of FIG. 13.

FIG. 15 shows the semiconductor die package of FIG. 13 from the perspective of a first side wall.

FIG. 16 shows the semiconductor die package of FIG. 13 from the perspective of a second side wall.

FIG. 17 illustrates a fourth embodiment of a semiconductor die package in accordance with the present invention.

FIG. 18 shows the semiconductor die package of FIG. 17 from the perspective of a second side wall.

DESCRIPTION OF THE PREFERRED EMBODIMENT

Reference will now be made in detail to the present exemplary embodiment(s) of the invention illustrated in the accompanying drawings. Wherever possible, the same reference numbers will be used throughout the drawings to refer to the same or like parts.

Figure 1:
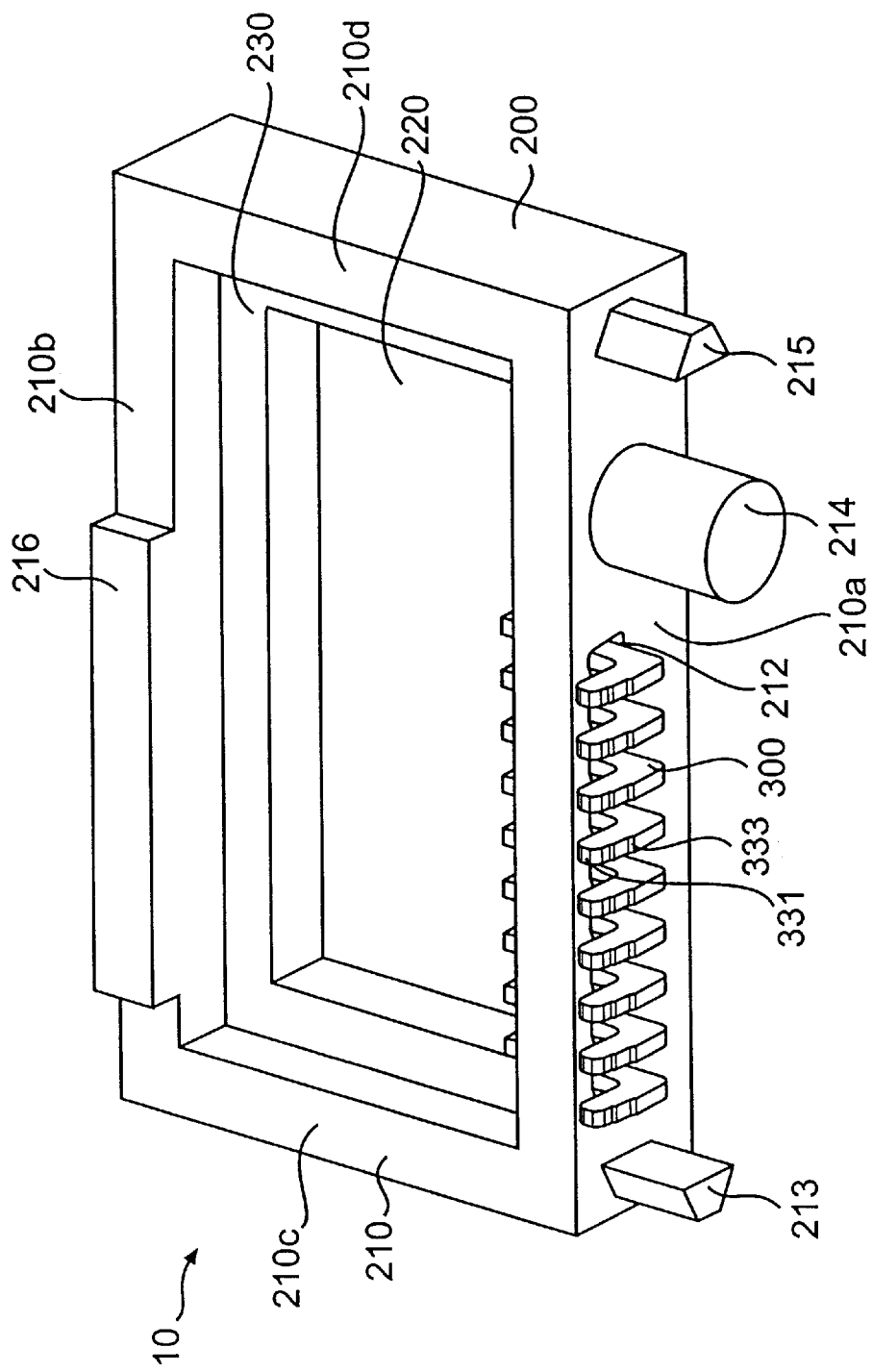
FIG. 1 illustrates a semiconductor die package in accordance with a first embodiment of the invention.

FIG. 1 illustrates a first embodiment of the invention. As shown in FIG. 1, a semiconductor die package 10 for holding one or more semiconductor dies 100 (not shown in FIG. 1) includes a housing 200 and a plurality of leads 300 retained in the housing 200. As discussed in greater detail below in connection with FIG. 7, the leads 300 may be L-shaped so that their end surfaces 331 can be surface mounted to a substrate, such as a printed circuit board, when the package 10 is mounted in a horizontal configuration. Further, a side surface 333 of the leads 300 can be surface mounted to a substrate in an upright configuration.

Figure 8:
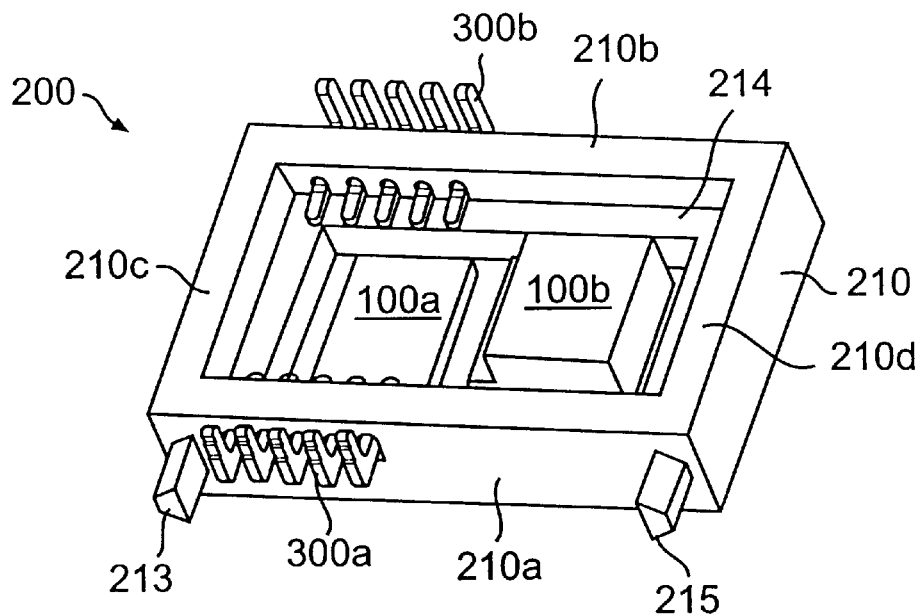
FIG. 8 illustrates a second embodiment of a semiconductor die package of the present invention.
Figure 9:
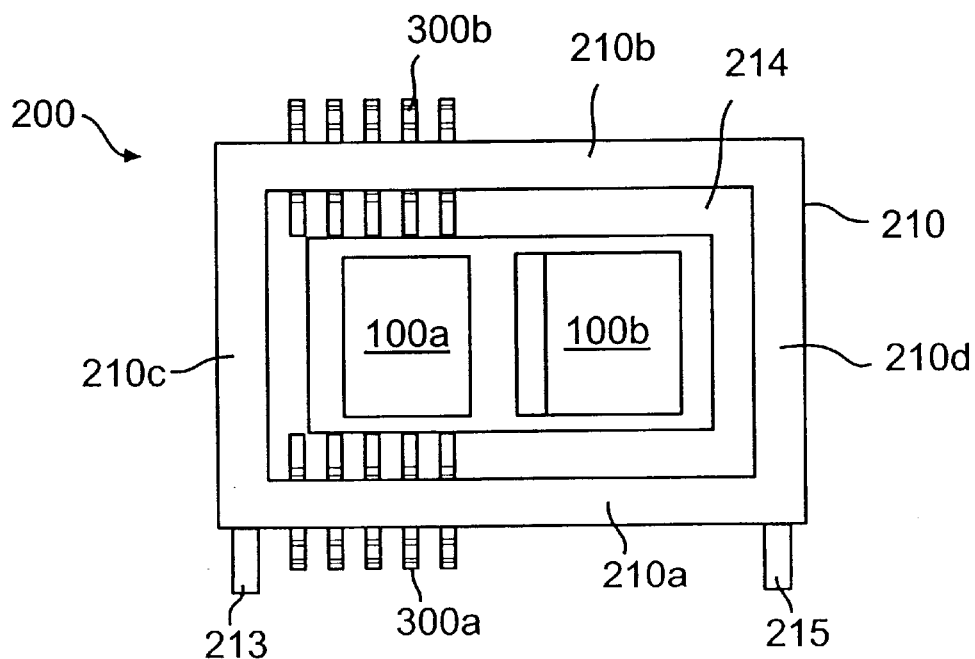
FIG. 9 shows the bottom of the semiconductor die package shown in FIG. 8.
Figure 10:
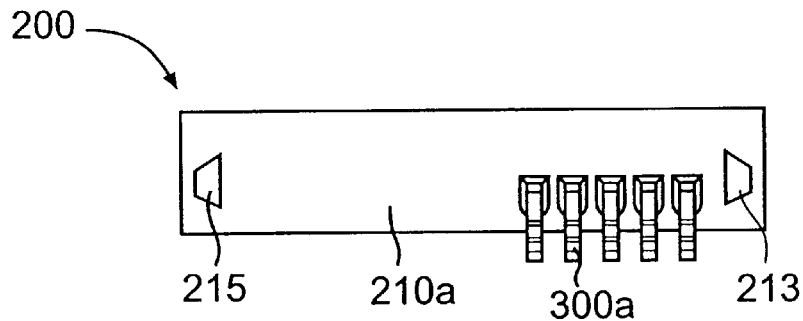
FIG. 10 shows the semiconductor die package of FIG. 8 from the perspective of a first side wall.

One or more semiconductor dies may be housed within housing 200. For example, one or more semiconductor dies may be mounted to end plate 220 using an adhesive. Reference is made to FIGS. 8 and 9 for additional details concerning the semiconductor die(s). After electrically connecting the semiconductor die(s) to leads 300, an encapsulant (not shown) may be used to fill the cavity defined by the housing 200 and thus seal the semiconductor dies in the housing 200. In one preferred embodiment, the encapsulant material may be an insulative polymer, for example, an insulative polymer having the same or similar thermal expansion properties as silicon. The polymer may be, for example, a liquid crystal polymer, such as VECTRA™, available from Hoechst-Celanese. The encapsulant may bond to the portion of leads 300 exposed within the housing 200. Alternatively or in addition, the housing 200 may be capped. In this regard, the encapsulant and/or cap may be considered part of the housing 200.

Figure 2:
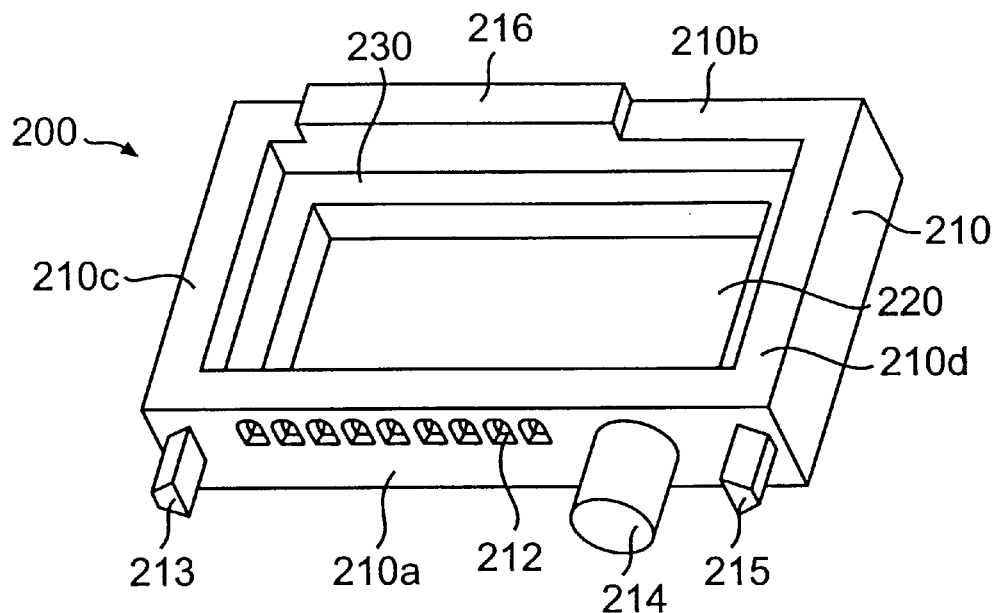
FIG. 2 illustrates the housing of the semiconductor die package shown in FIG. 1.
Figure 5:
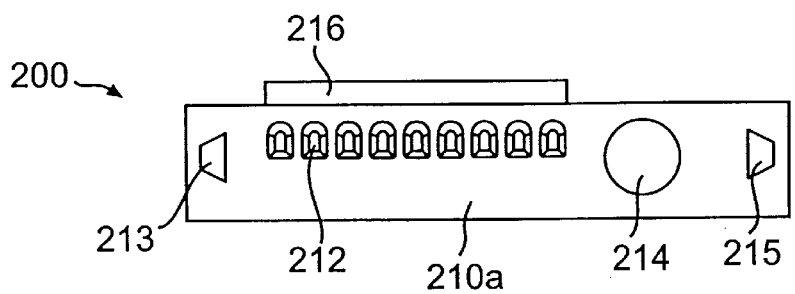
FIG. 5 shows the housing of the semiconductor die package shown in FIG. 1 from the perspective of a first side wall.
Figure 6:
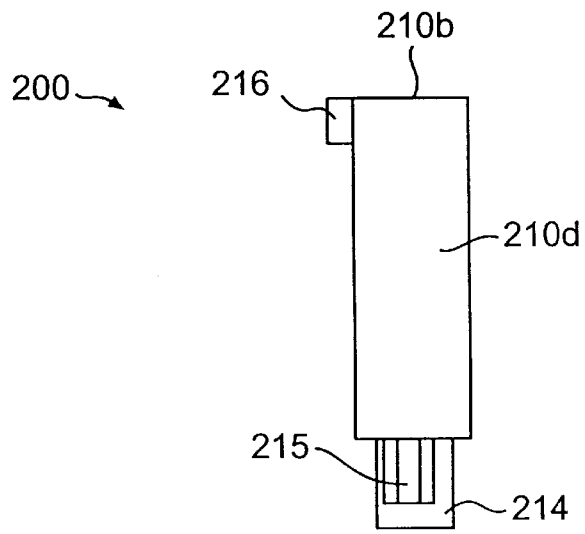
FIG. 6 shows the housing of the semiconductor die package shown in FIG. 1 from the perspective of a second side wall.

The housing 200 will be described in connection with FIGS. 1–6. The housing 200 includes side walls 210 and an end plate 220 joined to the side walls 210. In one preferred embodiment, one of the side walls 210a includes openings 212 formed therethrough for receiving leads 300. It should be clear that providing leads 300 on a single side wall 210a facilitates mounting the package in both horizontal and vertical configurations, because each of leads 300 can contact the substrate to which the package is mounted regardless of the mounting configuration. As best seen in FIGS. 2 and 5, the openings 212 are preferably shaped like tombstones, i.e., generally rectangular with two square corners opposite two rounded corners, to facilitate retention and accurate positioning of the leads 300.

Side wall 210a may include one or more projections 213, 214, and 215. Projections 213 and 215 serve as stabilizing posts. They may be inserted into corresponding holes or apertures in a substrate to which the semiconductor die package is mounted in an upright configuration. Projections 213 and 215 prevent the package from pivoting, rotating, or shifting from proper position on the substrate. By doing so, projections 213 and 215 resist stresses that would otherwise be borne solely by the solder joints between the leads 300 and the substrate. By reducing the stresses on the solder joints, the durability of the mounting connection is enhanced. Projection 214 may be used both to stabilize the package and to ensure that the package is mounted to the substrate in the proper orientation. Similar to projections 213 and 215, projection 214 may be received in a corresponding hole or aperture formed in the substrate. Projections 213, 214, and 215 further protect leads 300 from potential damage before the package is mounted and when the package is mounted in a horizontal configuration. While providing certain benefits, the invention may be practiced without one or more of projections 213, 214, and 215. Notwithstanding, one or more of the projections 213–215 may be provided on the other semiconductor die package embodiments disclosed herein.

As shown in FIGS. 1, 2, and 4–6, a standoff 216 may extends along a bottom surface of a side wall 210b, which is opposite side wall 210a. Standoff 216 may extend along the entire bottom surface of side wall 210b or just a portion, as shown in the Figures. The height of the standoff 216 is set so that the standoff 216 is substantially coplanar with the end surfaces 331 of the L-shaped leads 300. Accordingly, when the housing is horizontally mounted to a substrate, such as a printed circuit board, the housing 200 is balanced on the end surfaces 331 of leads 300 and the standoff 216 and is therefore stable. Additional standoffs (not shown) may be provided elsewhere on the bottom surfaces of side walls 210a and 210b and/or on the bottom surface of one or more of the remaining side walls 210c and 210d to further enhance stability. In embodiments utilizing a cap to enclose the semiconductor die(s), the standoff 216 may extend from the cap rather than the side wall. In any case, the benefit of standoff 216 is achieved when it extends from the bottom of the package to compensate for the extension of leads 300 beyond the bottom surface of the housing.

Figure 3:
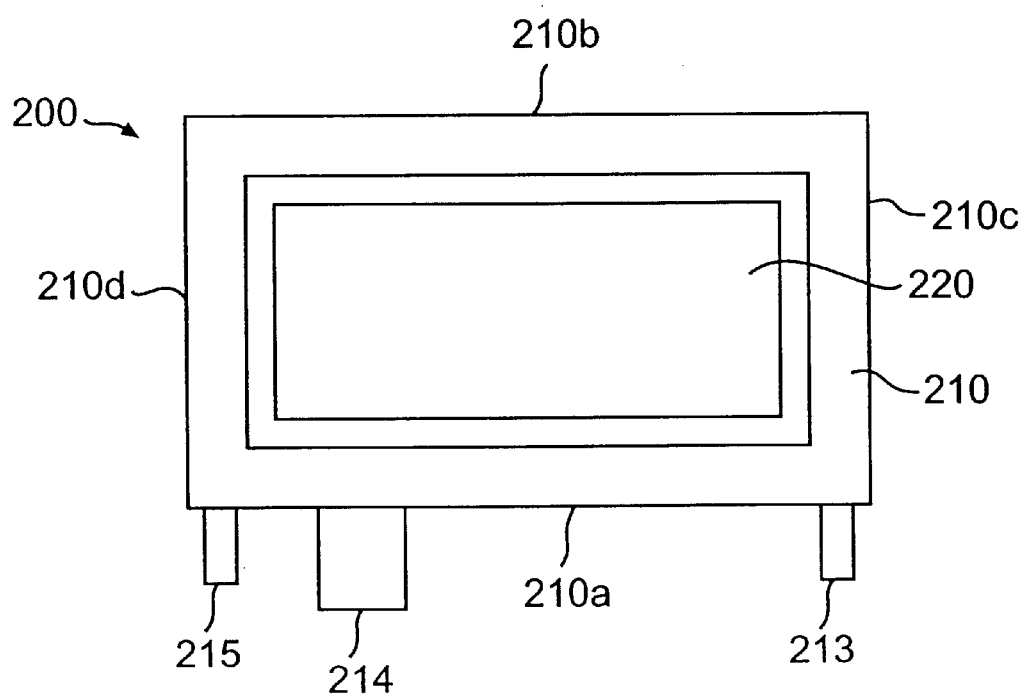
FIG. 3 shows the top of the housing of the semiconductor die package shown in FIG. 1.
Figure 4:
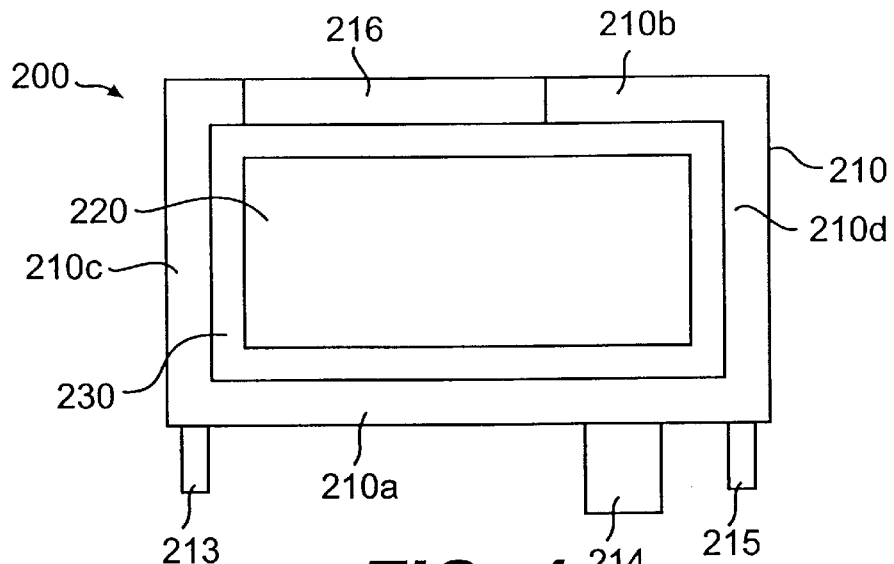
FIG. 4 shows the bottom of the housing of the semiconductor die package shown in FIG. 1.

FIGS. 1 and 3, for example, show that the inner surface of side walls 210 may include a step 230 that is aligned with openings 212 for supporting and locating a row of leads 300. The side walls 210 are preferably molded from an insulative, polymeric material, such as a liquid crystal polymer. One suitable liquid crystal polymer is VECTRA™, which is available from Hoechst-Celanese. Of course, housing 200 may be made of any suitable organic or inorganic material or combination of materials. The openings 212 may be molded into the side walls 210 or may be formed after molding by removing material from the side walls 210. Further, the side walls 210 may be formed together as a single unit or, alternatively, molded separately and then joined together using an adhesive or other suitable means.

The end plate 220 may be formed of the same material as the side walls 210 and integrally molded with the side walls 210, or the end plate 220 may be formed separately and then attached. Additional structural features of the end plate 200 will be discussed below in connection with FIG. 12. In one embodiment, the side walls 210 and end plate 220 are made from different materials. For example, the end plate 220 may be made of a heat sink material or combination of materials, such as copper, copper with a diamond coating, copper with a black oxide coating, or other material(s) having a high thermal conductivity. The semiconductor die or dies may be mounted directly to the end plate 220. This enables heat generated by the dies to be efficiently transferred to the exterior of the package 10 through the end plate 220.

Cooling structure may be mounted to the opposite (external) side of the end plate 220. For example, cooling fins, a fan, an electrothermal cooling plate, or a combination of these features may be coupled to the external side of end plate 220. In one preferred embodiment, the end plate 220 may be equipped with the cooling device disclosed in U.S. application Ser. No. 08/970,503, filed Nov. 15, 1997, and hereby incorporated by reference.

Figure 7:
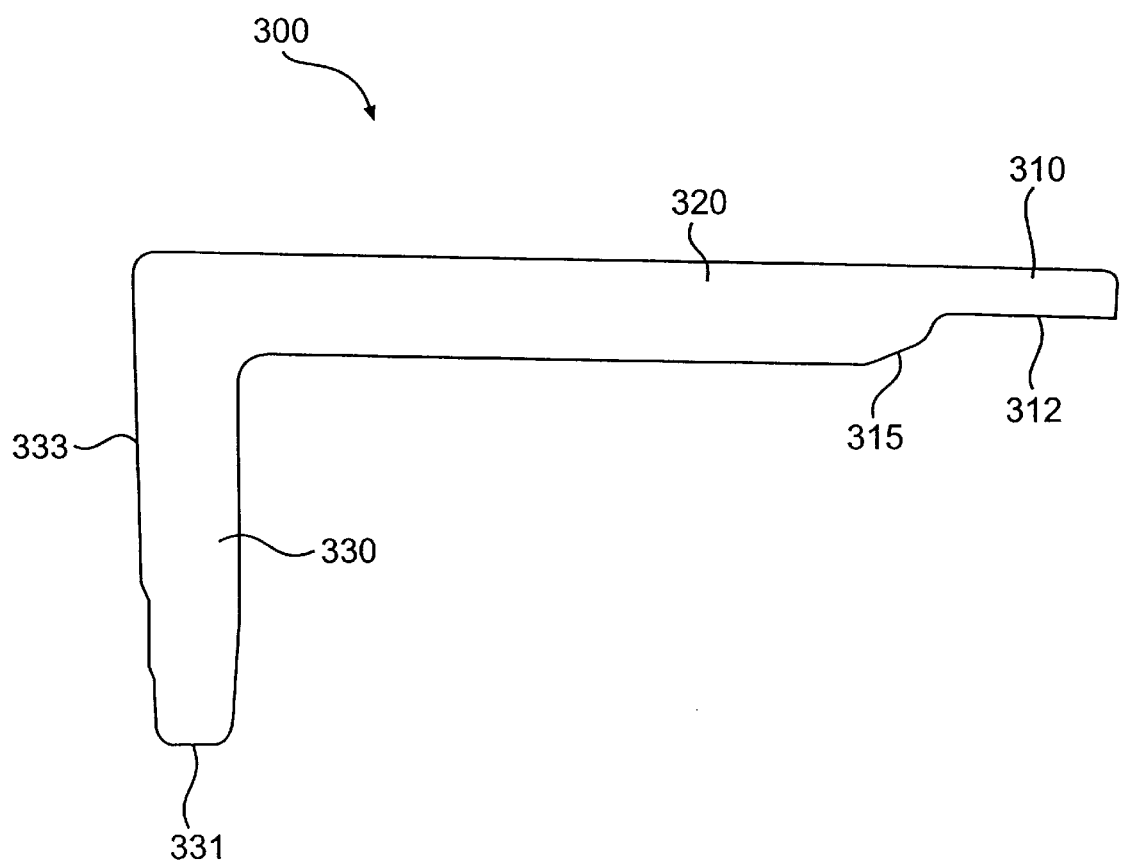
FIG. 7 illustrates an embodiment of a L-shaped conductive lead of the semiconductor die package shown in FIG. 1.

FIG. 7 illustrates one embodiment of the conductive leads 300. As shown in FIG. 7, the conductive leads 300 are preferably L-shaped. The conductive leads 300 each include an internal lead section 310, a stabilizing section 320, and an external lead section 330. The internal lead section 310 resides inside the housing 200. The internal lead section 310 may be relatively narrow compared to the stabilizing section 320 to facilitate insertion of the lead 300 into the opening 212 of the housing 200. A sloping transitional section 315 couples the internal lead section 310 to the stabilizing section 320. Sloping transitional section 315 prevents the lead from digging into the housing 200 upon insertion. The internal lead section 310 includes a flat bonding surface 312 for contacting electrically conductive material (not shown in FIG. 7) used to connect the leads to the semiconductor die(s). The bonding surface 312 may be plated with gold or another highly conductive material to ensure a reliable electrical connection.

In one preferred embodiment, stabilizing section 320 frictionally engages the inner walls of housing 200 in opening 212. The strength of the frictional engagement may be sufficient to retain lead 300 in housing 200. Alternatively, the leads 300 may be bonded to the housing 200 using a suitable adhesive. Further, the housing 200, or just the side walls 210, may be molded around the leads 300. In a preferred embodiment, the stabilizing section 320 has a rectangular cross section with its height greater than its width. When the opening 212 is tombstone-shaped, the rounded corners of the opening 212 force the sides of stabilizing section 320 against the flat sides of the opening 212, which are opposite the rounded corners, to accurately position the lead 300 against the step 230. In addition, the corners of the stabilizing section 320 of the lead 300 press into the rounded corners of the opening 212 to help secure the lead 300.

The external lead section 330 extends from the side wall 210 of the housing 200 and may have the same axial dimensions as the stabilizing section 320 to produce a robust, rigid lead that is difficult to bend. As discussed further below, the leads 300 may be arranged in multiple, vertically spaced rows or tiers through the side walls 210. The L-shaped leads 300 are designed for surface mounting in both horizontal and upright configurations. The end surfaces 331 of external lead sections 330 are planar to facilitate surface mounting to bonding pads on the surface of a substrate, for example a printed circuit board, when the package is mounted in a horizontal configuration. Of course, the ends 331 of the external lead sections 330 may be mounted to a printed circuit board or other substrate by other means, such as, for example, plated through hole (PTH) technology. The external side surface 333 of the lead 300 is also planar to facilitate surface mounting to bonding pads on the surface of a substrate, for example a printed circuit board, when the package is mounted in an upright configuration The external side surface 333 mounts flat to the surface of the bonding pad on the substrate. This promotes not only a good electrical contact, but also a stable, balanced, and durable connection.

The leads 300 are preferably stamped from a metal blank into an L-shape and then finished by machining. In this way, the leads 300 are extremely rigid because they are not bent or designed to be bent during manufacture. Accordingly, leads 300 resist bending when mounted to a substrate, such as a printed circuit board, and provide a sturdy, stable connection.

FIGS. 8–12 illustrate a further embodiment of the invention. It should be understood that the specific features of and manufacturing processes for the housing 200 and leads 300 described above in connection with FIGS. 1–7 are applicable to the present embodiment, but will not be repeated for the sake of brevity. As shown in FIGS. 8–12, L-shaped leads 300 are arranged in two groups, with one group of leads 300*a* extending from side wall 210*a* and one group of leads 300*b* extending from side wall 210*b*. In one preferred embodiment, the leads 300*b* are not electrically connected to a semiconductor die, but instead serve as stabilizer leads to stabilize and balance the package when mounted in a horizontal configuration. Accordingly, a standoff may be omitted from the bottom surface of side wall 210*b*. Of course, standoffs may be provided on the bottom surfaces of one or more of side walls 210 to enhance stability, as discussed above. Moreover, because the stabilizer leads are not electrically connected to a semiconductor die, they do not require electrical connection to the substrate when the package is mounted in an upright configuration.

FIGS. 8 and 9 further show that the housing 200 may house multiple semiconductor dies 300. For example, two semiconductor dies 100*a* and 100*b* may be housed in housing 200. The two dies 100*a* and 100*b* may be mounted directly to the end plate 220, for example, using a suitable adhesive. Of course, rather than direct mounting to the end plate 220, the dies 100*a* and 100*b* may be mounted to an intervening substrate, which may be electrically active, such as a ceramic substrate or circuit board.

Semiconductor die 100*b* may be a sensor die, for example, an acceleration sensor for use in triggering inflation of an automotive airbag. Semiconductor die 100*a* may be a controller die for controlling the sensor die, storing control routines and data, performing logical operations on the sensor die output, and/or storing the output of the sensor die, among other things. In such an arrangement, electrically conductive material, e.g., bonding wires, tape automated bonding (TAB), jumper wires or the like, may be used to couple the sensor die 100*b* to the controller die 100*a*. The controller die 100*a* may be similarly connected to the L-shaped leads 300*a* extending from side wall 210*a* so that all inputs from and all outputs to other components on the substrate are applied to controller die 100*a*. Alternatively, the sensor die 100*b* may receive power and ground signals, and other inputs and/or outputs, directly through leads 300 or indirectly from an electrical path external to controller die 100*a*, such as a ground or power plane within the housing or an electrical path formed on a substrate, e.g., a ceramic substrate or a circuit board. Of course, the leads 300, the controller die 100*a*, and the sensor die 100*b* may be interconnected in any way that facilitates functionality and operation efficiency for the particular application in accordance with the design of the dies 100*a* and 100*b* and the other components of the electrical system.

After bonding the semiconductor die(s) to the leads 300, the housing 200 may be filled with an encapsulant to seal in the semiconductor dies therewithin, as discussed above. In such as case, the encapsulant may bond to the portion of leads 300 that is exposed within the housing 200. In addition, or in the alternative, the housing 200 may be capped. In this regard, the encapsulant and/or cap may be considered part of the housing 200.

Figure 11:
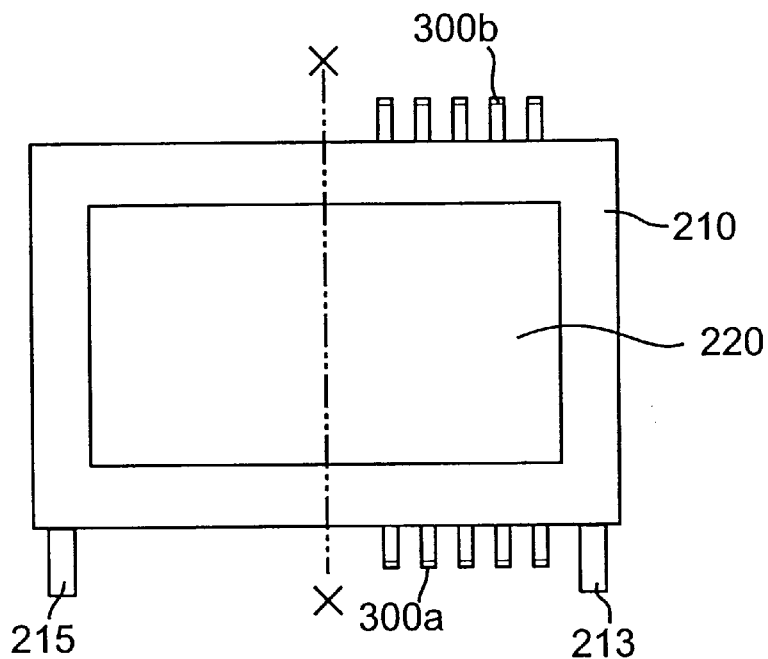
FIG. 11 shows the top of the semiconductor die package shown in FIG. 8.
Figure 12:
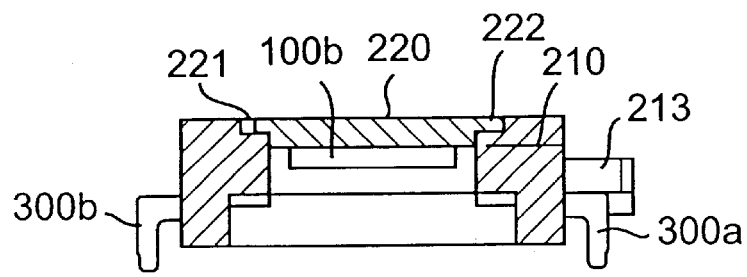
FIG. 12 shows a cross section taken through line X—X of FIG. 11.

FIG. 12 shows a cross section of the housing 200 taken along line X—X of FIG. 11. As shown in FIG. 12, the periphery of the end plate 220 may include a step 221 and a narrowed peripheral portion 222. When molded into the side walls 210, the step 221 and the narrowed peripheral portion 222 increase the length of the interface between the side walls 210 and the end plate 220, thereby more effectively preventing moisture and other possible contaminants from entering the housing 200. Alternatively, the end plate 220 may have a uniform thickness.

Figure 13:
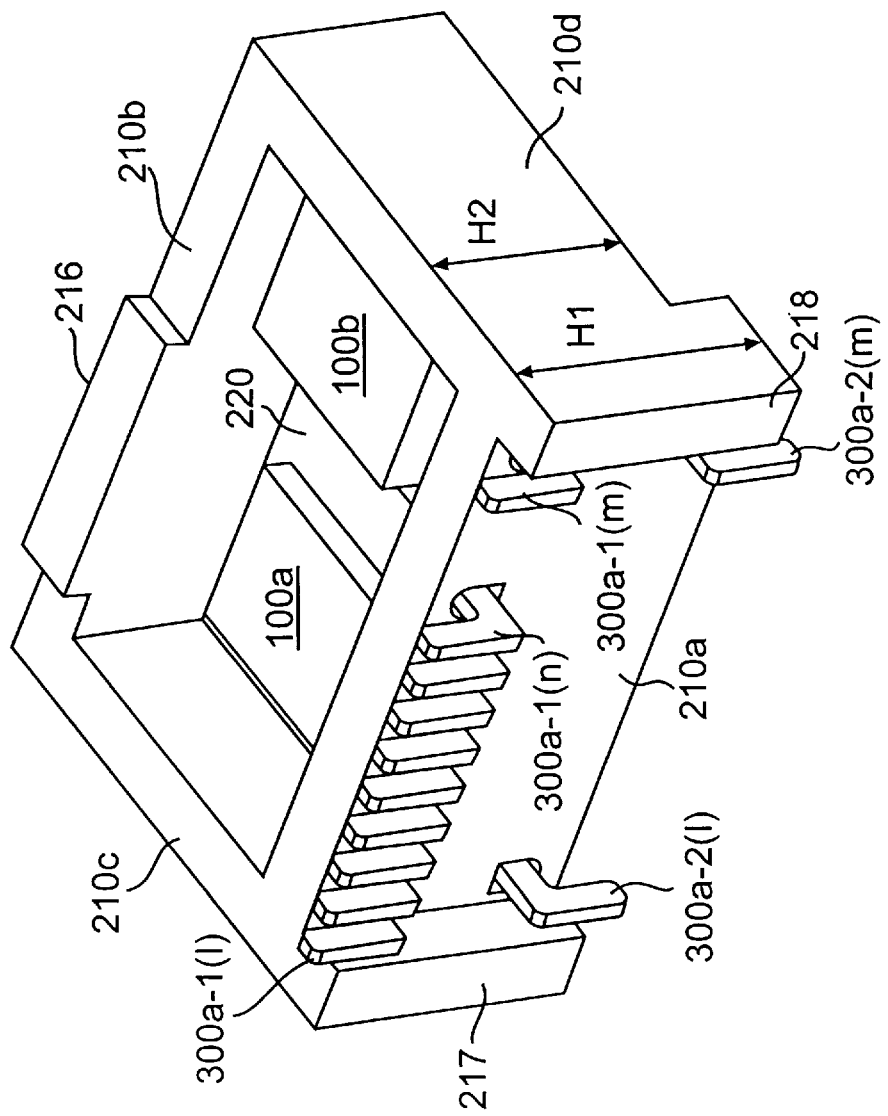
FIG. 13 illustrates a third embodiment of a semiconductor die package in accordance with the present invention.

FIGS. 13–16 illustrate a further embodiment of the invention. It should be understood that the specific features of and manufacturing processes for the housing 200 and leads 300 described above are applicable to the present embodiment, but will not be repeated for the sake of brevity. As shown in FIGS. 13–16, side wall 210*a* includes two vertically-spaced rows of leads 300*a*-1 and 300*a*-2 and first and second end supports 217 and 218. As shown in FIGS. 13–15, the first row of leads 300*a*-1 includes a group of leads 300*a*-1(1) to 300*a*-1(n), and individual lead 300*a*-1(m), and the second group of leads 300*a*-2 includes 300*a*-2(1) and 300*a*-2(m). FIGS. 13–15 show a gap between lead 300*a*-1(m) and lead 300*a*-1(n) and a gap between lead 300*a*-2(1) and lead 300*a*-2(m). Either or both of these gaps may be filled in, in whole or in part, with additional leads 300 consistent with the present invention. Further, individual leads 300*a*-1(m), 300*a*-2(1), and 300*a*-2(m) may be replaced by multiple leads without departing from the invention.

Leads 300*a*-2(1) and 300*a*-2(m) are positioned in a direction opposite that of leads 300*a*-1(1) to 300*a*-1(m). Accordingly, when mounted in a horizontal configuration, leads 300*a*-1(1) to 300*a*-1(m) contact a substrate while leads 300*a*-2(1) and 300*a*-2(m) are directed away from the substrate. Leads 300*a*-1(1) to 300*a*-1(n) may be used to interconnect semiconductor die 100*a* and/or 100*b* to the substrate, as discussed above in connection with FIGS. 8–12. As above, semiconductor die 100*a* may be a controller die and semiconductor die 100*b* may be a sensor die, for example, an acceleration sensor die.

In one preferred embodiment, leads 300*a*-2(1) and 300*a*-2(m) function solely as stabilizer leads. That is, they are not electrically connected to a semiconductor die or any other electrical element in the housing 200. Rather, they serve to secure and stabilize the connection of the package to a substrate in an upright configuration. In this regard, leads 300*a*-2(1) and 300*a*-2(m) may be soldered or otherwise connected to the substrate, for example, a printed circuit board, but they are not electrically active and do not couple electrical signals to and from a semiconductor die. Alternatively, leads 300*a*-2(1) and/or lead 300*a*-2(m) may be connected to a ground or power plane within the housing 200 or may serve as a ground connection from the substrate to electrical shielding for reducing electromagnetic interference.

Similarly, lead 300*a*-1(m) may serve solely as a stabilizer lead or may be connected to a ground plane, a power plane, or to electromagnetic shielding. Alternatively, lead 300*a*-1(m) may be directly connected to a die 100 within the housing, for example, a sensor die 100*b*. As shown in the Figures, leads 300*a*-1(1), 300*a*-1(m), 300*a*-2(1), and 300*a*-2(m) are positioned at the outer periphery of side wall 210*a*, e.g., at its corners. This increases the base of support provided by leads 300*a*-1(1), 300*a*-1(m), 300*a*-2(1), and 300*a*-2(m) to increase stability and better secure the package to the substrate when mounted in an upright configuration. Additional leads (not shown) extending from side wall 210*b* may be provided. The additional leads may be arranged as shown in FIGS. 8–12, for example, or may be provided opposite lead 300*a*-1(m) and the outermost lead 300*a*-1(1). Such an arrangement may be used to enhance stability and securement of the package when mounted in a horizontal configuration.

The surfaces of end supports 217 and 218 are substantially coplanar with the side surfaces 333 of the leads 300, as shown, for example, in FIG. 16. Thus, end supports 217, 218 mount flush with the surface of the substrate when the package is mounted in an upright configuration. In this way, end supports 217 and 218 provide additional stability to the package when mounted. To provide still further stabilization, the height H1 of the end supports 217 and 218 and side wall 210*a* is greater that the height H2 of the remaining side walls 210 of the housing 200. The end supports 217 and 218 thus provide a large footprint on the surface of the substrate for added stability.

The invention may be practiced without end supports and side wall 210*a* having increased height H1. As shown in FIGS. 17–18, end supports 217 and 218 and side wall 210*a* may have the same height H2 as the remaining side walls 210 of the housing 200. Further, the embodiments shown in FIGS. 13–18 may include one or more projections 213–215 and/or one or more additional standoffs on the bottom surface of the side walls 210. While FIGS. 13–18 show side walls 210 without a step 230, a step 230 may be provided. Also, the housings 200 shown in FIGS. 13–18 may be encapsulated and/or capped, as described above.

Figure 19:
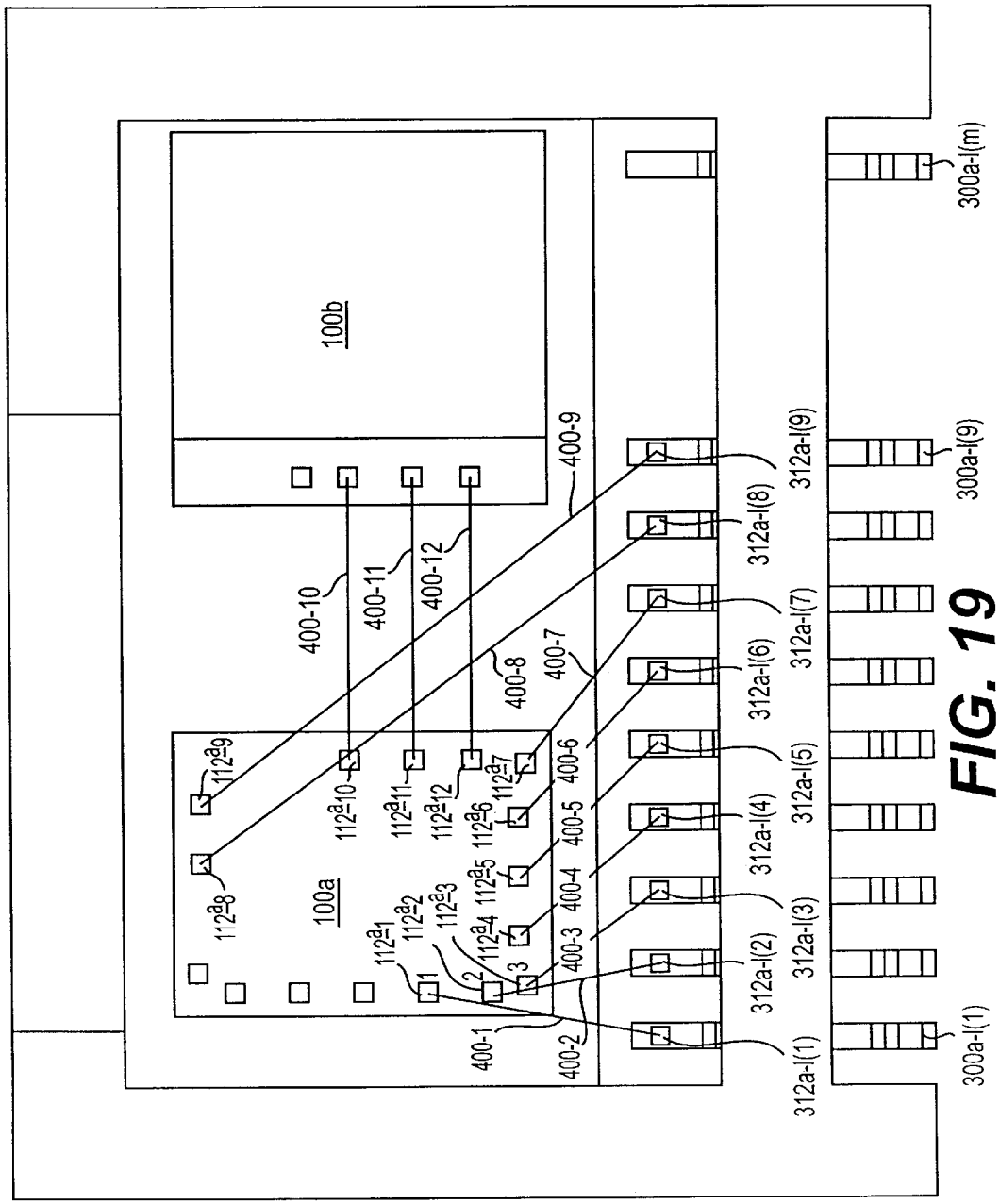
FIG. 19 shows a particular bonding arrangement for a semiconductor die package of FIGS. 13–18.
Figure 20:
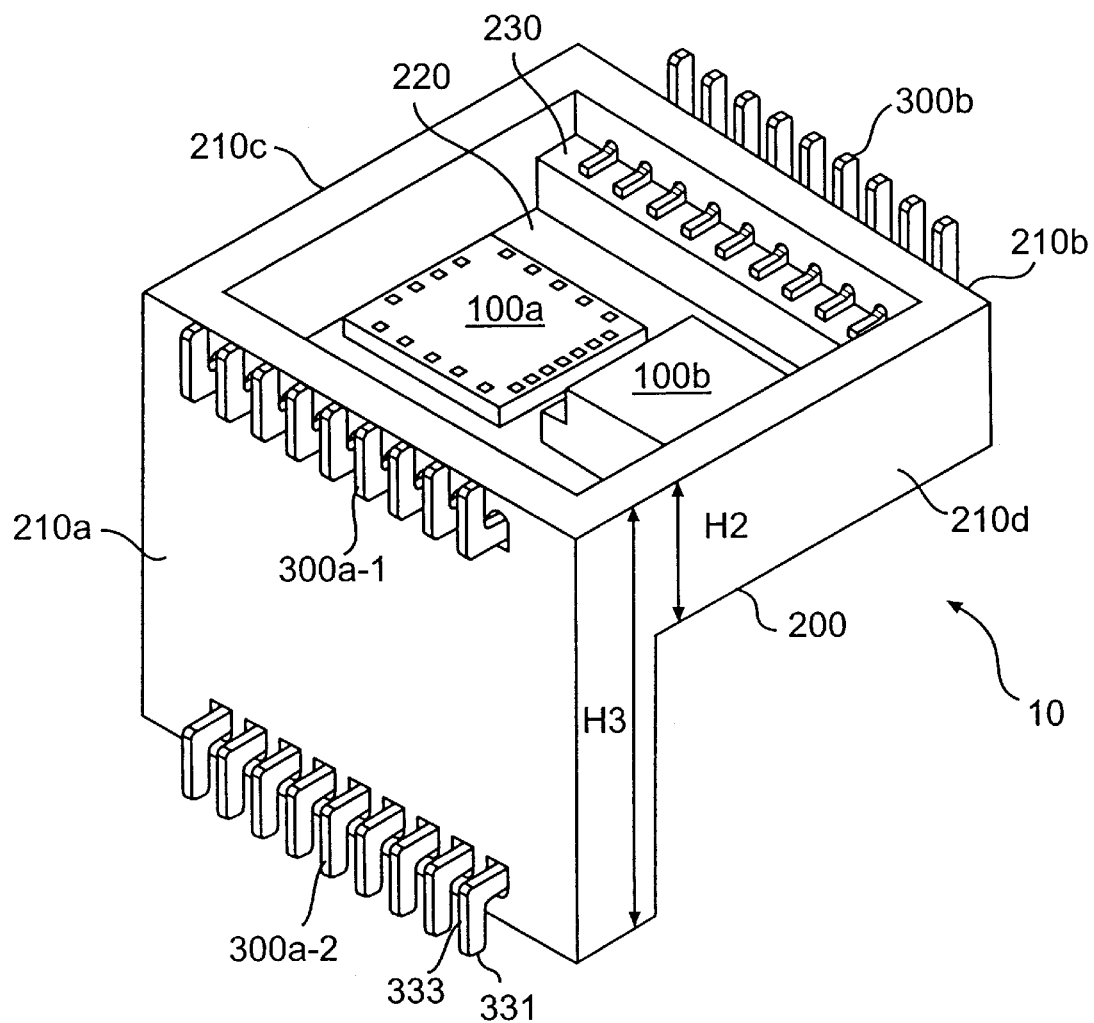
FIG. 20 illustrates a further embodiment of a semiconductor die package according to the invention.
Figure 21:
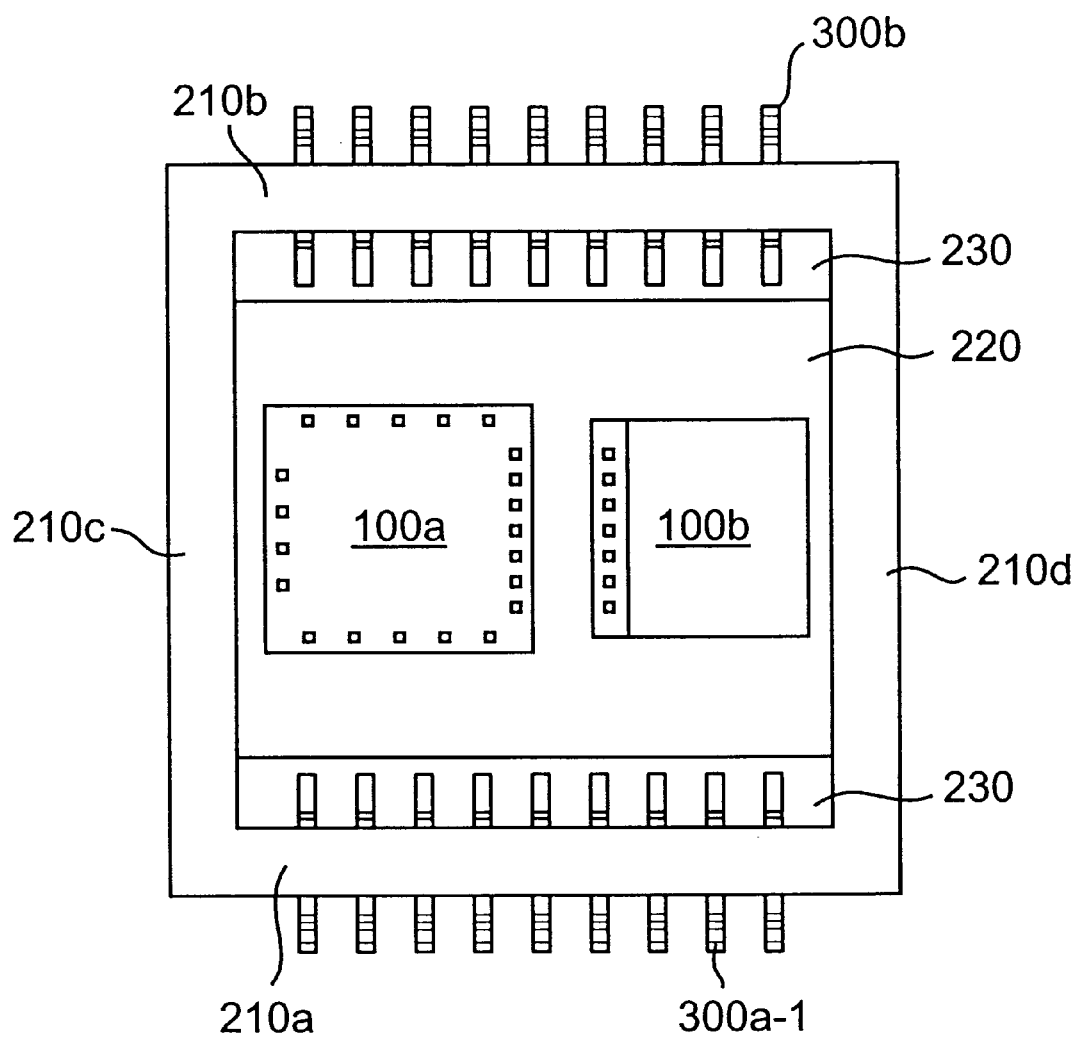
FIG. 21 shows the bottom of the semiconductor die package of FIG. 20.
Figure 22:
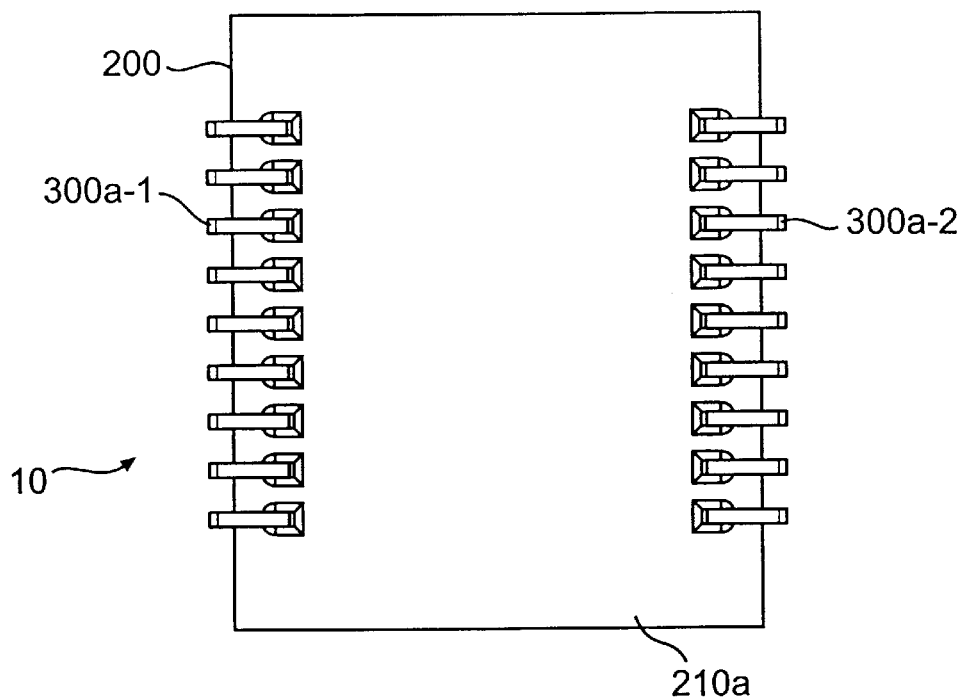
FIG. 22 shows the semiconductor die package of FIG. 20 from the perspective of a first side wall thereof.
Figure 23:
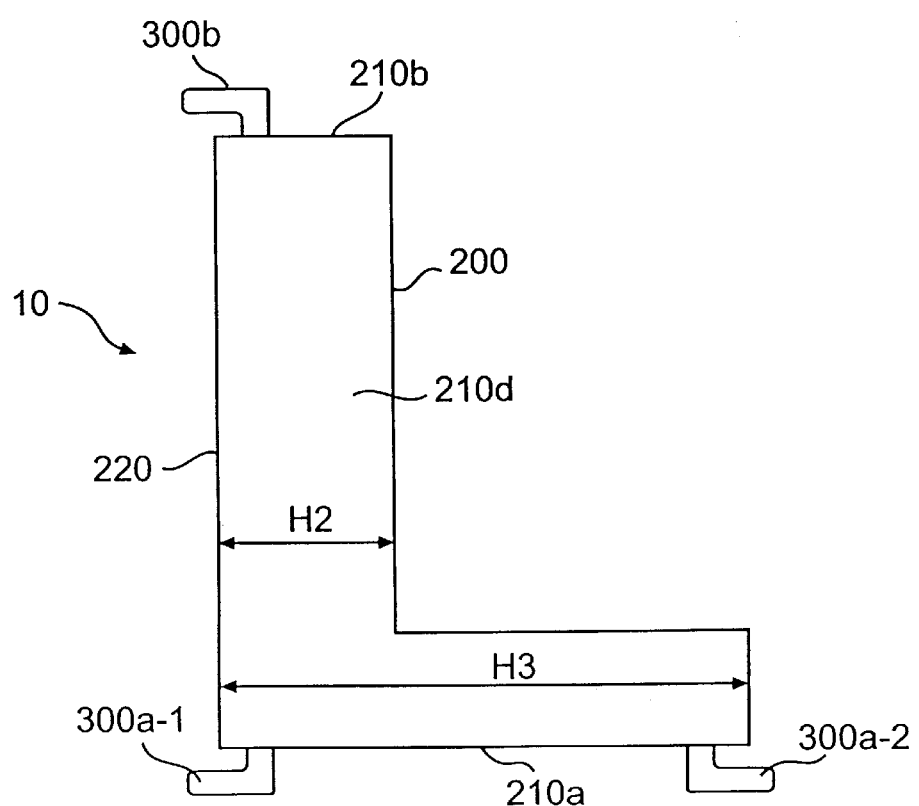
FIG. 23 shows the semiconductor die package of FIG. 20 from the perspective of a second side wall thereof.
Figure 24:
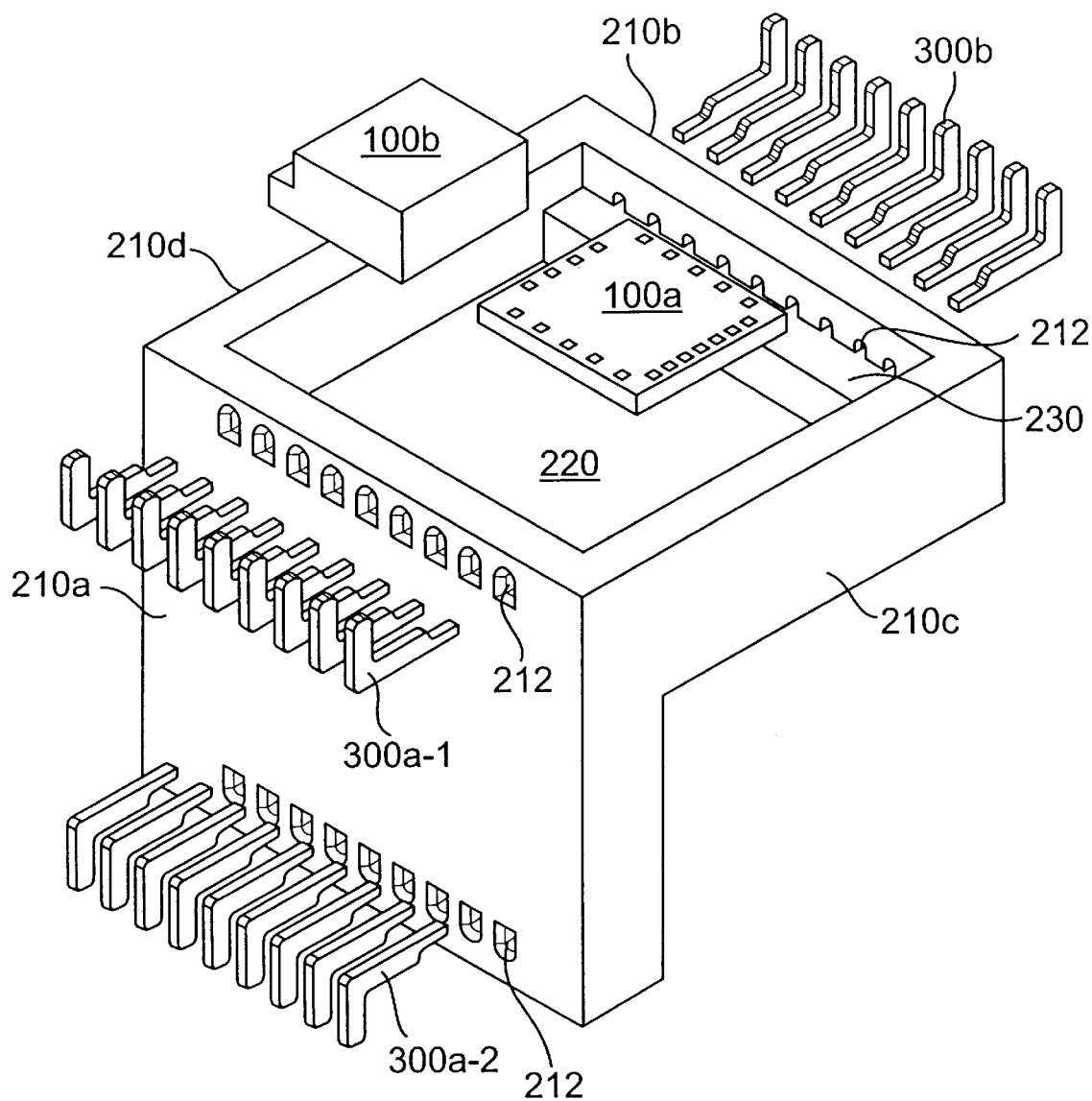
FIG. 24 illustrates an exploded view of the semiconductor die package of FIG. 20.

FIG. 19 shows a particular interconnect arrangement for a semiconductor package 10 shown in FIGS. 13–18. Semiconductor dies 100*a* and 100*b* each include bonding pads 112 arranged at the periphery of the dies to enable connection to the leads 300. In particular, leads 300*a* each include a bonding surface 312*a* within housing 200. Bonding pads 112*a*-1 to 112*a*-9 of semiconductor die 100*a* are connected to bonding surfaces 312*a*-1(1) to 312*a*-1(9) via wire bonds 400-1 to 400-9. Bonding pads 112*a*-10 to 112*a*-12 of semiconductor die 100*a* are connected to bonding pads of semiconductor die 100*b* via wire bonds 400-10 to 400-12.

It should be noted that one embodiment of the invention allows wire bonds 400-8 and 400-9 to extend over wire bonds 400-10 to 400-12 to make a connection with bonding surfaces 312a-1(8) and 312a-1(9). This may be accomplished by designing the housing 200 so that the bonding surfaces 312 of the leads are at a higher level than the bonding pads 112 of the semiconductor dies 100. Therefore, the wire bond interconnection from the bonding pad of the semiconductor die to the leads 300 rises up and over the wire bond interconnection between the semiconductor dies 100.

FIGS. 20–33B show a further embodiment of a semiconductor die package. It should be understood that the specific features of and manufacturing processes for the housing 200 and leads 300 described above are applicable to the present embodiment, but will not be repeated for the sake of brevity. As shown in the FIGS. 20–24, for example, housing 200 is generally L-shaped and includes a projecting side wall 210a having a height H3 that is greater than the height H2 of the other side walls 210. For example, the height H3 of side wall 210a may be more than three times the height H2 of the remaining side walls 210 and may be comparable to the length of the side wall 210a. The L-shaped housing 200 provides a wide base of support in both horizontal and upright mounting configurations. Housing 200 otherwise may include the features and may be manufactured in the manner discussed above in connection with other embodiments.

Leads 300 are arranged in three rows. Leads 300a-1 extend in a first row from side wall 210a, leads 300a-2 extend in a second row from side wall 210a, and leads 300b extend from side wall 210b. As shown in FIGS. 20–24, for example, leads 300a-1 are spaced apart from leads 300a-2 to provide a wide base of support to stabilize the package when mounted in an upright configuration. The end surfaces 331 of leads 300a-1 and leads 300b may be substantially coplanar to enhance stability. In addition or in the alternative, the side surfaces 333 of leads 300a-1 and 300a-2 may be substantially coplanar to enhance stability. In one preferred embodiment, leads 300a-2 are not connected to a semiconductor die and are not electrically active, but function solely as stabilizer leads, as described above, to stabilize the package when mounted in an upright configuration. Likewise, leads 300b may function solely as stabilizer leads in the manner discussed above in connection with FIGS. 8–12.

Figure 25:
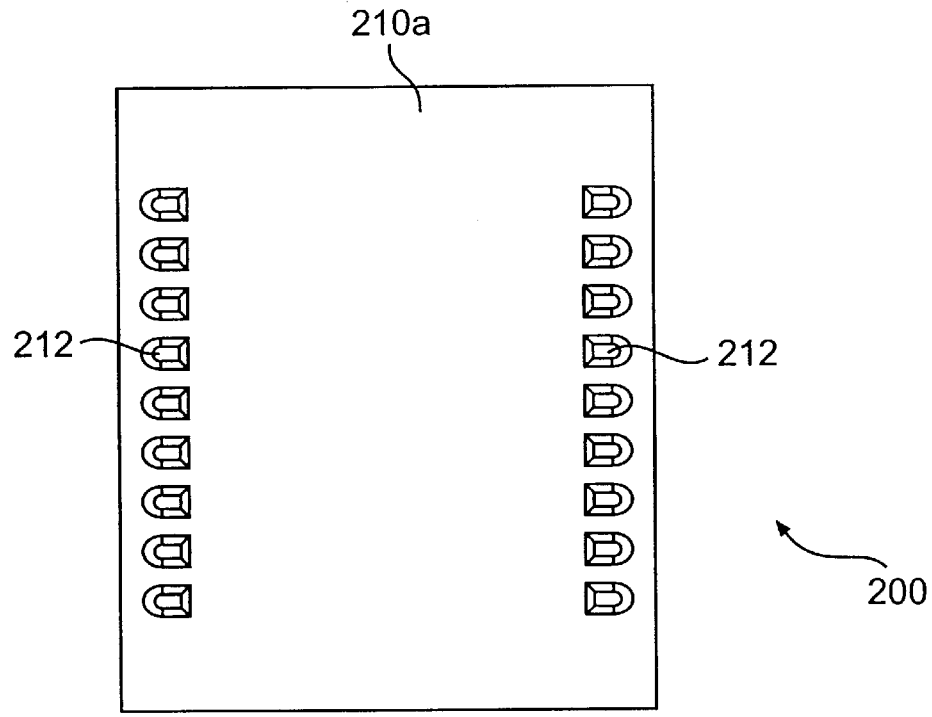
FIG. 25 shows the housing of the semiconductor die package of FIG. 20 from the perspective of the first side wall.
Figure 26:
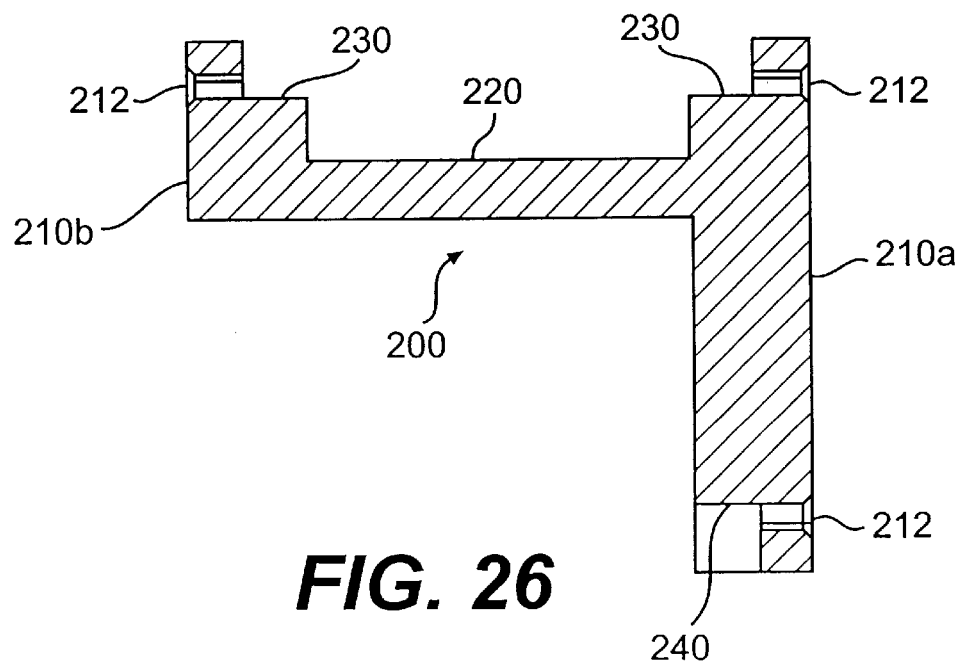
FIG. 26 shows a cross section of the housing of the semiconductor die package of FIG. 20.

FIGS. 25 and 26 illustrate additional features of housing 200. As shown in FIG. 25, openings 212 are preferably shaped like a tombstone. FIG. 26 provides a cross section of the housing 200, including a cross section of openings 212. As shown clearly in FIG. 26, the openings 212 facing the exterior of the housing 200 may be flared to facilitate insertion of leads 300. Of course, this feature may not be provided if the housing 200, or side walls 210, are molded around leads 300. FIG. 26 also shows a step 240 aligned with the openings 212 that receive leads 300a-2.

Figure 27:
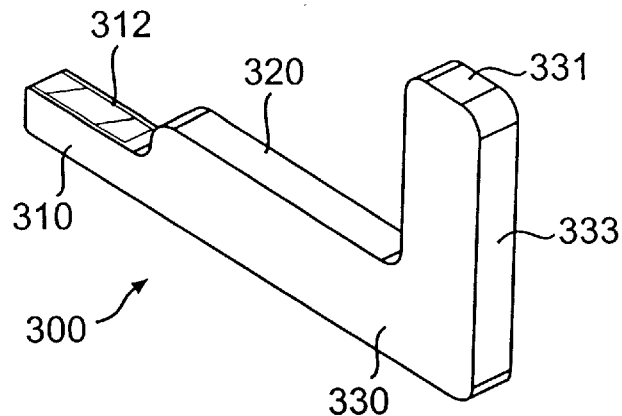
FIGS. 27–29 illustrate an embodiment of a lead for use in the semiconductor die package of FIG. 20.
Figure 28:
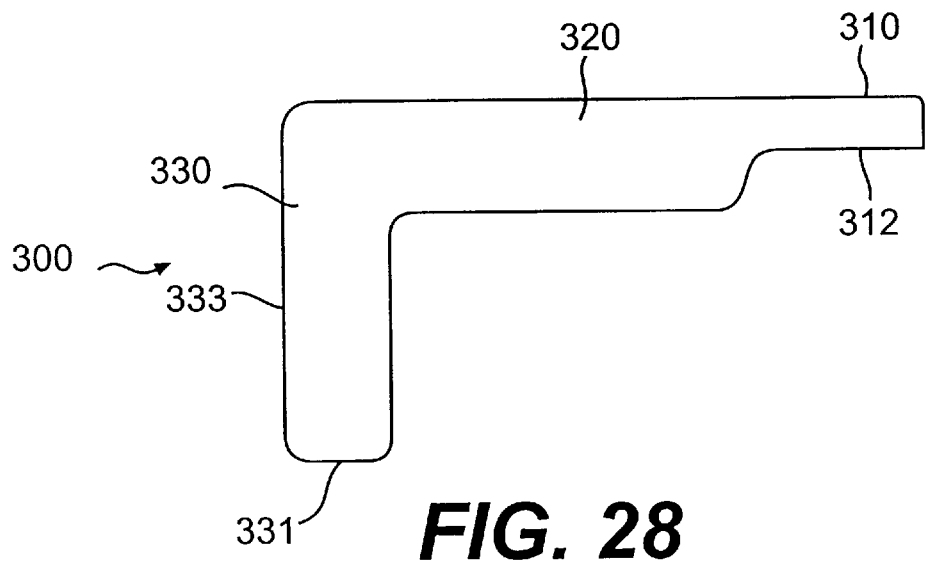
Figure 29:
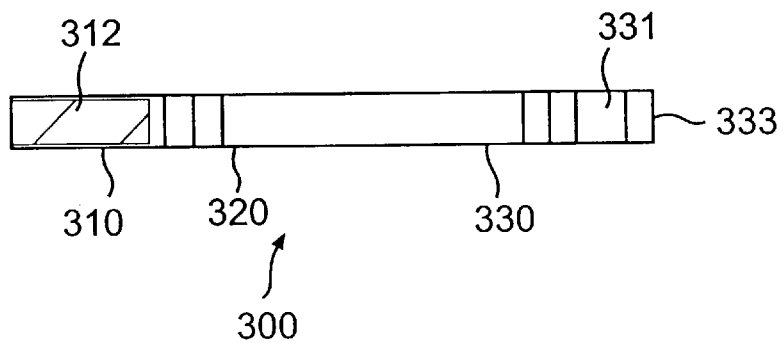

FIGS. 27, 28, and 29 illustrate an embodiment of leads 300 that may be used in the semiconductor die package. It should be understood that the specific features of and manufacturing processes for leads 300 described above in connection with FIG. 7 are applicable to the present embodiment, but will not be repeated for the sake of brevity. FIGS. 27 and 28 show the bonding surface 312 of the lead 300. Further, the side surface 333 of the external lead section 330 is planar as shown and does not taper as shown in FIG. 7. This increases the surface area that can contact the substrate when the package is mounted in an upright configuration.

Figure 30:
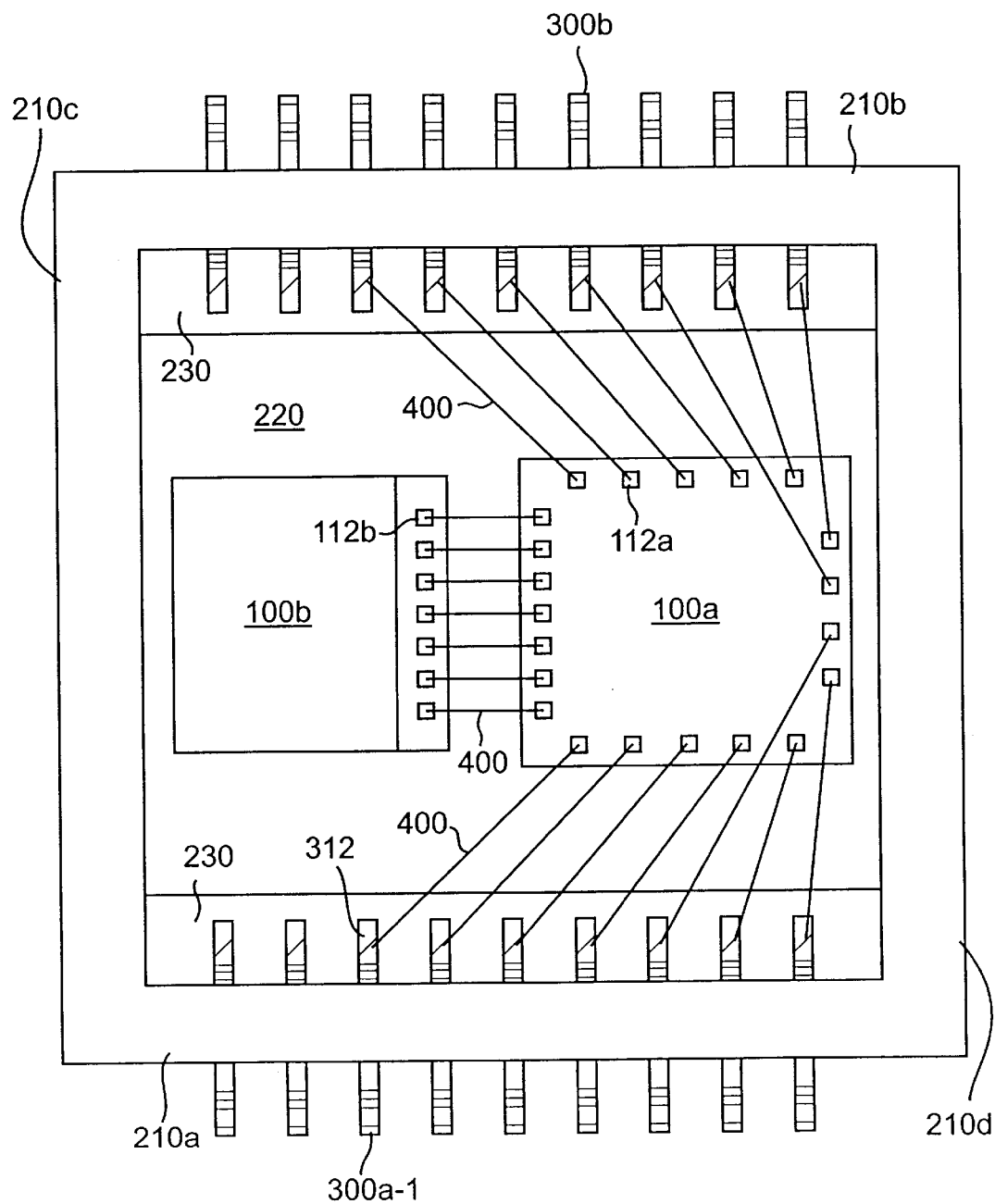
FIG. 30 illustrates a particular bonding arrangement for the semiconductor die package of FIG. 20.

FIG. 30 illustrates a particular bonding arrangement for connecting semiconductor die 100a to semiconductor die 100b and to leads 300. As shown, the bonding pads 112a of semiconductor die 100a are electrically connected to the bonding pads 112b on an adjacent side of semiconductor die 100b. The electrical connection may be established by wire bonding, tape automated bonding, jumper wires, or the like. In addition, bonding pads 112a are electrically connected both to bonding surfaces of leads 300a-1 and 300b.

In this arrangement, leads 300b may be connected to the semiconductor die(s) 100 for conducting various tests of the semiconductor dies before the package is connected to the substrate, but are not used to carry electrical signals to and from the semiconductor dies during normal operations when the package is mounted to the substrate. The leads 300a-1 may be connected to the semiconductor die(s) to enable normal operation (e.g., not test functions) when the package is mounted to the substrate. Of course, the leads 300a-1 may additionally be used to perform test functions both before and after the package is mounted to the substrate. Leads 300a-1 in this arrangement are the only leads that carry electrical signals to and from the semiconductor die(s) during normal operations and, as such, can contact the substrate when the package is mounted in either horizontal or upright configurations.

Figure 31A:
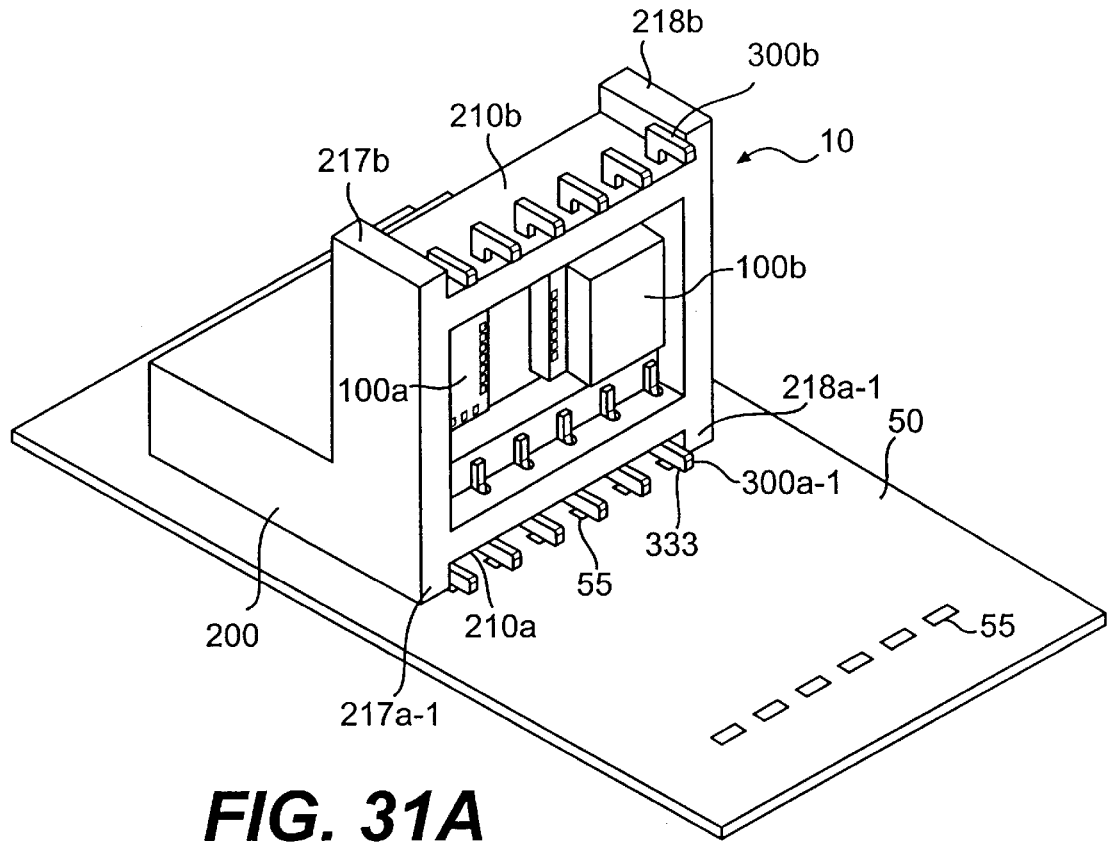
FIGS. 31A and 31B illustrate a first upright mounting configuration for the semiconductor die package of FIG. 20.
Figure 31B:
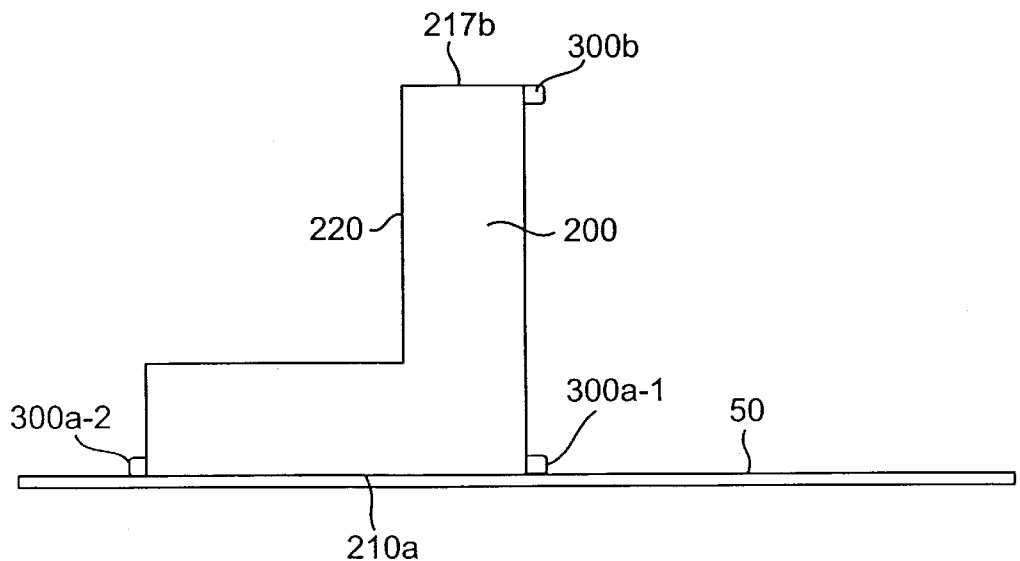
Figure 32A:
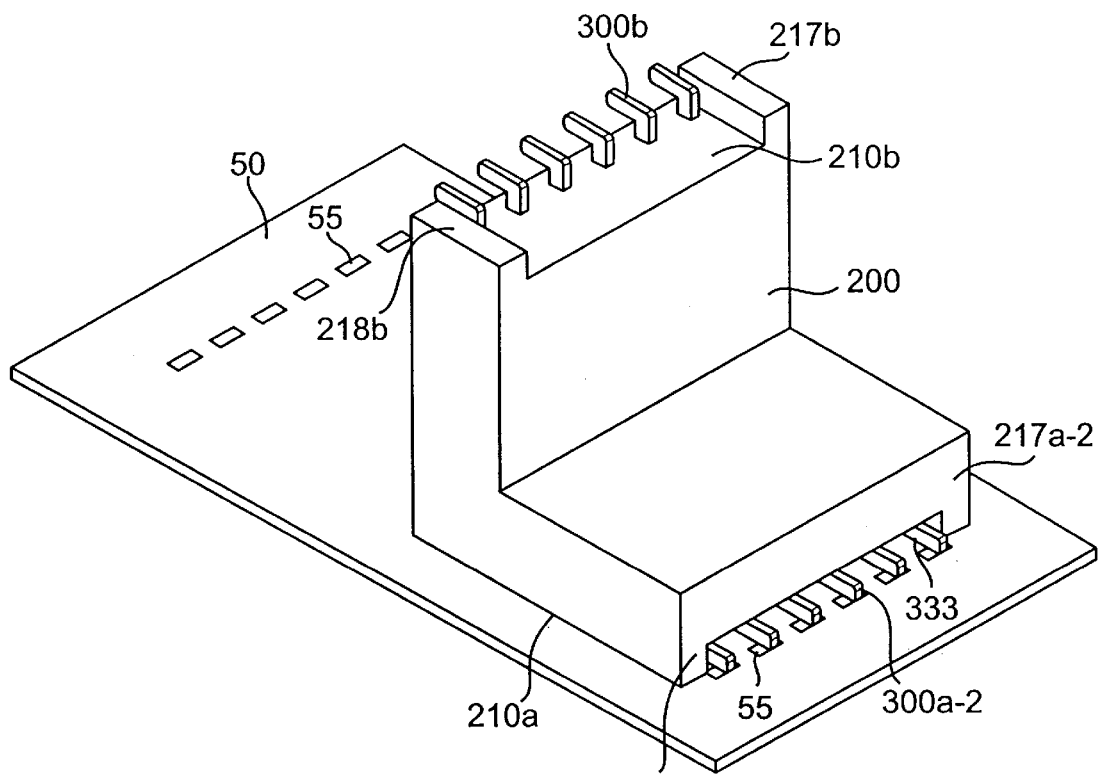
FIGS. 32A and 32B illustrate a second upright mounting configuration for the semiconductor die package of FIG. 20.

FIGS. 31A, 31B, 32A, 32B, 33A, and 33B show different mounting configurations for the semiconductor die package. As shown in these Figures, the housing 200 may include end supports 217a-1 and 218a-1 on side wall 210a at the outer ends of the row of leads 300a-1, end supports 217a-2 and 218a-2 on side wall 210a at the outer ends of the row of leads 300a-2, and end supports 217b and 218b on side wall 210b at the outer ends of the row of leads 300b. Further, as shown, the end supports may be connected by a connecting portion. The connecting portion may overhang all or part of the leads 300 to provide further protection. For example, a connecting portion is shown in FIG. 32A between end supports 217a-2 and 218a-2.

FIGS. 31A and 31B show a first upright mounting configuration. The housing 200 mounts to a substrate 50, for example a printed circuit board, such that the edge of the semiconductor die(s) 100 faces the substrate 50. The side surfaces 333 of leads 300a-1 and 300a-2 are shown to contact bonding pads 55 on the substrate. The leads 300a-1 and 300a-2 may be soldered to the bonding pads 55 to secure the package to the substrate. For purposes of illustration, the housing 200 is not shown to be encapsulated or capped.

Figure 32B:
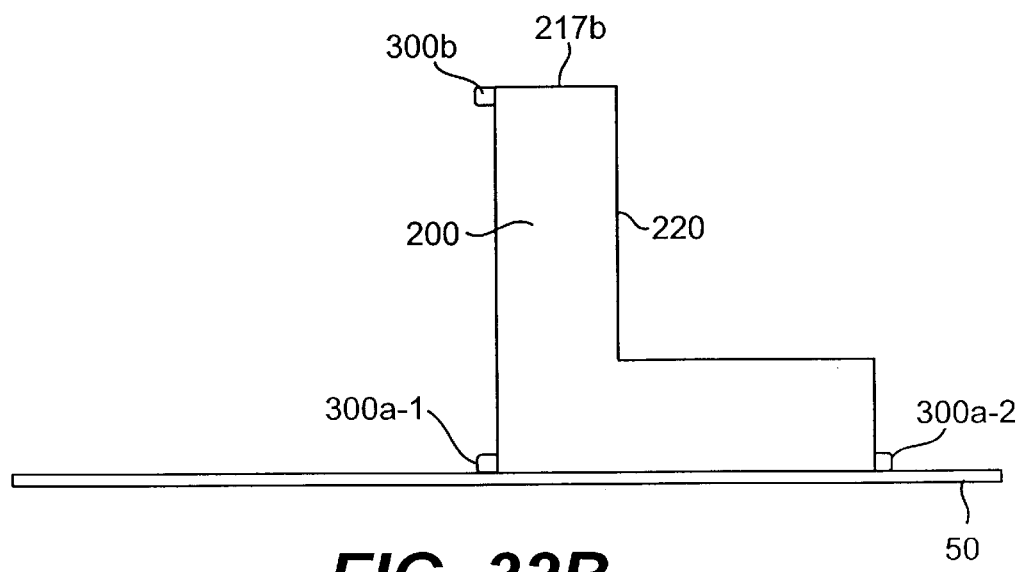

FIGS. 32A and 32B show a second upright mounting configuration. While FIGS. 32A and 32B mount to substrate 50 in the same general way as shown in FIGS. 31A and 31B, the semiconductor die(s) 100 face in the opposite direction. This may be important in applications that use direction-sensitive sensors.

Figure 33A:
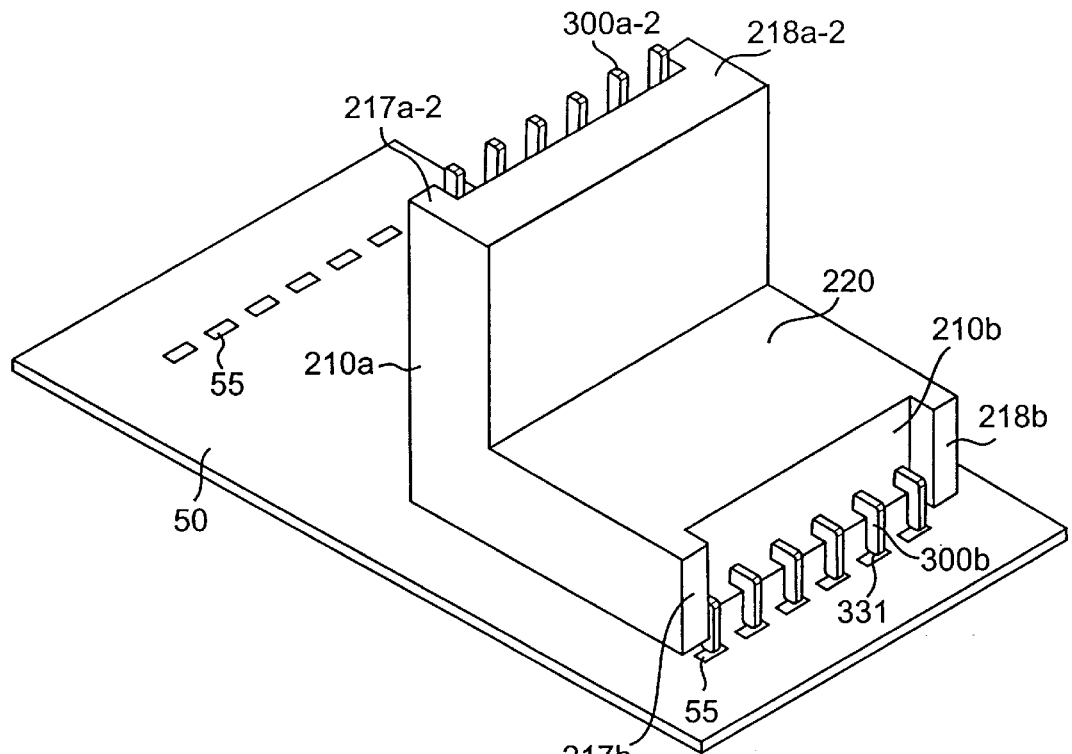
FIGS. 33A and 33B illustrate a horizontal configuration for the semiconductor die package of FIG. 20.
Figure 33B:
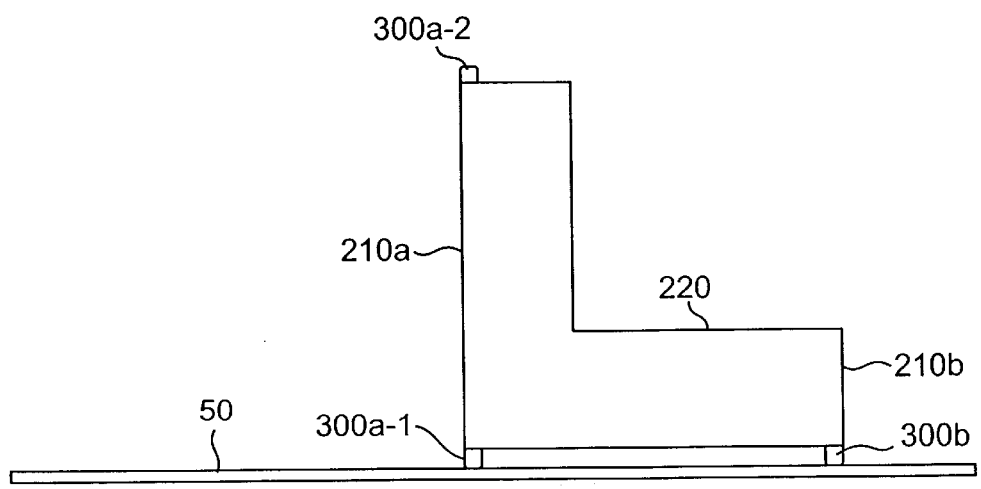

FIGS. 33A and 33B show a horizontal mounting configuration. As shown, the housing 200 mounts to substrate 50 such that the active surface of the semiconductor die(s) 100 faces the substrate 50. The end surfaces 331 of leads 300a-1 and 300b contact bonding pads 55 on the substrate and may be soldered in place. Accordingly, the package can be mounted in both upright and horizontal configurations.

It will be apparent to those skilled in the art that various modifications and variations can be made without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor die package comprising:
   a housing for holding at least one semiconductor die; and
   a plurality of L-shaped, electrically-conductive leads extending from the housing, each of said leads having a side surface for surface mounting to a printed circuit board when said semiconductor die package is mounted to the printed circuit board in an upright configuration and an end surface substantially perpendicular to the side surface for surface mounting to a printed circuit board when said semiconductor die package is mounted to the printed circuit board in a horizontal configuration,
   wherein said leads extend from said side of said housing in two spaced-apart rows, and the end surfaces of said leads of said first row point in a first direction and the end surfaces of the leads of said second row point in a second direction opposite to the first direction.

2. A semiconductor die package comprising:
   a substantially L-shaped housing for holding at least one semiconductor die; and
   a plurality of L-shaped, electrically-conductive leads extending from the housing, each of said leads having a side surface for surface mounting to a printed circuit board when said semiconductor die package is mounted to the printed circuit board in an upright configuration and an end surface substantially perpendicular to the side surface for surface mounting to a printed circuit board when said semiconductor die package is mounted to the printed circuit board in a horizontal configuration.

3. A semiconductor die package according to claim 2, wherein said housing has an outer periphery including:
   a first substantially L-shaped outer side surface;
   a second substantially L-shaped outer side surface opposite the first outer side surface;
   a third outer side surface joining the first and second outer side surfaces; and
   a fourth outer side surface joining the first and second outer side surfaces, wherein the fourth outer side is opposite the third outer side surface and wherein said plurality of leads extend from at least the third outer side surface.

4. A semiconductor die carrier according to claim 3, wherein said leads extend from the third outer side surface in two spaced-apart rows.

5. A semiconductor die carrier according to claim 4, wherein the end surfaces of the leads of the first row point in a first direction and the end surfaces of the leads of the second row point in a second direction opposite the first direction.

6. A semiconductor die carrier according to claim 3, wherein said leads extend from said third outer side surface and said fourth outer side surface.

7. A semiconductor die carrier according to claim 3, wherein said leads extend from said third outer side surface in two spaced-apart rows and from said fourth outer side surface.

8. A semiconductor die carrier according to claim 7, wherein the end surfaces of said leads of said first row point in a first direction and the end surfaces of the leads of said second row point in a second direction opposite to the first direction.

9. A semiconductor die package comprising:
   a housing for holding at least one semiconductor die; and
   a plurality of electrically-conductive leads extending from the housing, each of said leads having a side surface for surface mounting to a printed circuit board when said semiconductor die package is mounted to the printed circuit board in an upright configuration and an end surface substantially perpendicular to the side surface for surface mounting to a printed circuit board when said semiconductor die package is mounted to the printed circuit board in a horizontal configuration,
   wherein said leads extend from an outer side surface of said housing in two spaced-apart rows, and the end surfaces of said leads of said first row point in a first direction and the end surfaces of the leads of said second row point in a second direction opposite to the first direction.

10. A semiconductor die carrier according to claim 1, wherein said leads extend from a single side of said housing.

11. A semiconductor die package comprising:
    a housing for holding at least one semiconductor die;
    a plurality of L-shaped, electrically-conductive leads extending from the housing, each of said leads having a side surface for surface mounting to a printed circuit board when said semiconductor die package is mounted to the printed circuit board in an upright configuration and an end surface substantially perpendicular to the side surface for surface mounting to a printed circuit board when said semiconductor die package is mounted to the printed circuit board in a horizontal configuration;
    first and second semiconductor dies housed within said housing; and
    electrically conductive material connecting one of said semiconductor dies to said leads.

12. A semiconductor die package comprising:
    a housing for holding at least one semiconductor die, said housing including a top, a bottom, and a plurality of outer side surfaces, said bottom surface including a standoff extending therefrom, said standoff adjacent a first outer side surface of said housing; and
    a plurality of L-shaped electrically-conductive leads extending from a second outer side surface of the housing opposite the first outer side surface, each of said leads having a side surface for surface mounting to a printed circuit board when said semiconductor die package is mounted to the printed circuit board in an upright configuration and an end surface substantially perpendicular to the side surface for surface mounting to a printed circuit board when said semiconductor die package is mounted to the printed circuit board in a horizontal configuration, wherein the end surface of each said lead is substantially coplanar with said standoff.

13. The semiconductor die package according to claim 12, wherein said standoff is integral with said first outer side surface.

14. The semiconductor die package according to claim 12, wherein the bottom of the housing comprises a cap and said standoff extends from said cap.

15. A semiconductor die package comprising:
    a package housing for housing at least one semiconductor die, said package housing having a top, a bottom, and a plurality of outer side surfaces, said bottom surface including a standoff extending therefrom, said standoff adjacent a first outer side surface of said housing; and
    a plurality of L-shaped, electrically-conductive leads extending from a second outer side surface of the housing opposite the first outer side surface, each of said L-shaped leads having an side surface for surface mounting to a printed circuit board when said semiconductor die package is mounted to the printed circuit board in an upright configuration and an end surface for surface mounting to the printed circuit board when said semiconductor die package is mounted to the printed circuit board in a horizontal configuration, wherein the end surface of each said lead is substantially coplanar with said standoff.

16. The semiconductor die package according to claim 15, wherein said standoff is integral with said first outer side surface.

17. The semiconductor die package according to claim 15, wherein the bottom of the housing comprises a cap and said standoff extends from said cap.

18. A semiconductor die package comprising:
a substantially L-shaped package housing for holding at least one semiconductor die; and
a plurality of L-shaped, electrically-conductive leads extending from the housing, each of said leads having a side surface for surface mounting to a printed circuit board when said semiconductor die package is mounted to the printed circuit board in an upright configuration and an end surface substantially perpendicular to the side surface for surface mounting to a printed circuit board when said semiconductor die package is mounted to the printed circuit board in a horizontal configuration.

19. A semiconductor die package according to claim 18, wherein said L-shaped housing comprises a plurality of outer side surfaces, a top surface, and a bottom surface, said leads extending from at least one of the outer side surfaces.

20. A semiconductor die package according to claim 19, wherein said outer side surfaces include a first substantially L-shaped outer side surface, a second substantially L-shaped outer side surface opposite the first outer side surface, and a third outer side surface joining the first and second outer side surfaces.

21. A semiconductor die package according to claim 20, wherein said leads extend from the third outer side surface in first and second spaced-apart rows.

22. A semiconductor die package according to claim 21, wherein said leads are substantially L-shaped.

23. A semiconductor die package according to claim 18, further comprising:
first and second semiconductor dies housed within said substantially L-shaped housing; and
electrically conductive material for connecting at least one of said semiconductor dies to at least some of said leads.

24. A semiconductor die carrier according to claim 18, wherein said leads extend from a side of said substantially L-shaped housing in two spaced-apart rows.

25. A semiconductor die carrier according to claim 24, wherein the leads of a first row are electrically connected to said at least one semiconductor die by said electrically conductive material and the leads of a second row are electrically isolated from electrical elements within said L-shaped housing.

26. A semiconductor die carrier according to claim 23, wherein said leads extend from a side of said substantially L-shaped housing in two spaced-apart rows.

27. A semiconductor die package according to claim 24, wherein said substantially L-shaped housing has a cavity for holding the at least one semiconductor die, the leads of a first row have an internal lead section extending within the cavity, and the leads of a second row are external to the cavity.

28. A semiconductor die package comprising:
a substantially L-shaped package housing for holding at least one semiconductor die, said substantially L-shaped housing comprising a plurality of outer side surfaces, a top surface, and a bottom surface, wherein said outer side surfaces include a first substantially L-shaped outer side surface, a second substantially L-shaped outer side surface opposite the first outer side surface, and a third outer side surface joining the first and second outer side surfaces; and
a plurality of leads extending from an exterior surface of the housing, said leads extending from the third outer side surface in first and second spaced-apart rows.

29. A semiconductor die package according to claim 28, wherein said leads are substantially L-shaped.

30. A semiconductor die package according to claim 29, wherein said leads of said first row point in a direction opposite to that of said leads of said second row.

31. A semiconductor die package comprising:
a substantially L-shaped package housing for holding at least one semiconductor die; and
a plurality of leads extending from an exterior surface of the housing;
first and second semiconductor dies housed within said substantially L-shaped housing; and
electrically conductive material for connecting at least one of said semiconductor dies to at least some of said leads.

32. A semiconductor die carrier according to claim 31, wherein said leads extend from a side of said substantially L-shaped housing in two spaced-apart rows.

33. A semiconductor die package comprising:
a substantially L-shaped package housing for holding at least one semiconductor die; and
a plurality of leads extending from an exterior surface of the housing, wherein said leads extend from a side of said substantially L-shaped housing in two spaced-apart rows.

34. A semiconductor die carrier according to claim 33, wherein the leads of a first row are electrically connected to said at least one semiconductor die by said electrically conductive material and the leads of a second row are electrically isolated from electrical elements within said substantially L-shaped housing.

35. A semiconductor die package according to claim 33, wherein said substantially L-shaped housing has a cavity for holding the at least one semiconductor die, the leads of a first row have an internal lead section extending within the cavity, and the leads of a second row are external to the cavity.

* * * * *